United States Patent
Imazeki et al.

(10) Patent No.: US 10,290,495 B2
(45) Date of Patent: May 14, 2019

(54) ELECTRONIC APPARATUS AND MANUFACTURING METHOD OF THE SAME

(71) Applicant: Japan Display Inc., Tokyo (JP)

(72) Inventors: Yoshikatsu Imazeki, Tokyo (JP); Shoji Hinata, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/660,339

(22) Filed: Jul. 26, 2017

(65) Prior Publication Data

US 2018/0033617 A1  Feb. 1, 2018

(30) Foreign Application Priority Data

Jul. 29, 2016 (JP) ................ 2016-149571
Jul. 29, 2016 (JP) ................ 2016-149572
Jul. 29, 2016 (JP) ................ 2016-149605
Jun. 21, 2017 (JP) ................ 2017-121427

(51) Int. Cl.
| | |
|---|---|
| *H01L 21/00* | (2006.01) |
| *H01L 21/02* | (2006.01) |
| *H01L 21/22* | (2006.01) |
| *C30B 29/22* | (2006.01) |
| *H01L 21/74* | (2006.01) |
| *G02F 1/1345* | (2006.01) |

(52) U.S. Cl.
CPC ........ *H01L 21/02304* (2013.01); *C30B 29/22* (2013.01); *G02F 1/1345* (2013.01); *H01L 21/02172* (2013.01); *H01L 21/02263* (2013.01); *H01L 21/22* (2013.01); *H01L 21/74* (2013.01)

(58) Field of Classification Search
CPC .. H01L 21/02304; H01L 21/74; G02F 1/1345
See application file for complete search history.

(56) References Cited

U.S. PATENT DOCUMENTS

| | | | | |
|---|---|---|---|---|
| 8,304,863 B2 * | 11/2012 | Filippi | .............. | H01L 21/76898 257/621 |
| 8,742,535 B2 * | 6/2014 | Bachman | .......... | H01L 21/76224 257/508 |

(Continued)

FOREIGN PATENT DOCUMENTS

| | | |
|---|---|---|
| CN | 104849893 | 8/2015 |
| CN | 105093629 | 11/2015 |

(Continued)

OTHER PUBLICATIONS

Taiwanese Office Action dated Apr. 18, 2018 in corresponding Taiwanese Application No. 106123629.

(Continued)

*Primary Examiner* — Laura M Menz
(74) *Attorney, Agent, or Firm* — K&L Gates LLP

(57) ABSTRACT

According to one embodiment, an electronic apparatus includes a first substrate including a first basement and a first conductive layer, a second substrate including a second basement, which is opposed to the first conductive layer and is separated from the first conductive layer, a second conductive layer, and a first hole penetrating the second basement, and a connecting material which electrically connects the first conductive layer and the second conductive layer via the first hole.

7 Claims, 27 Drawing Sheets

(56) References Cited

U.S. PATENT DOCUMENTS

| | | | |
|---|---|---|---|
| 8,895,360 B2* | 11/2014 | Chang | H01L 23/481 |
| | | | 438/109 |
| 8,987,137 B2* | 3/2015 | Bachman | H01L 21/76898 |
| | | | 438/677 |
| 9,048,233 B2* | 6/2015 | Wu | H01L 24/17 |
| 9,287,312 B2* | 3/2016 | Kao | H01L 27/14641 |
| 2011/0193199 A1 | 8/2011 | Filippi et al. | |

FOREIGN PATENT DOCUMENTS

| | | |
|---|---|---|
| JP | 2002-40465 A | 2/2002 |
| JP | 2002040468 | 2/2002 |
| KR | 20050064407 | 6/2005 |
| KR | 10-2015-0110382 | 10/2015 |
| TW | 201500999 | 1/2015 |

OTHER PUBLICATIONS

Korean Office Action dated Oct. 22, 2018 in corresponding Korean Application No. 10-2017-0093959.

\* cited by examiner

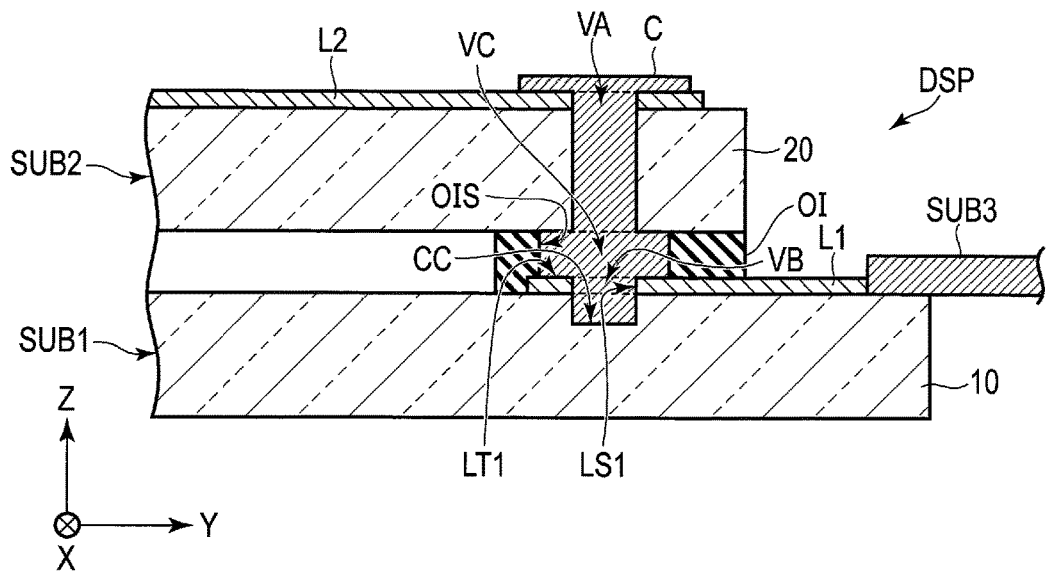
F I G. 3
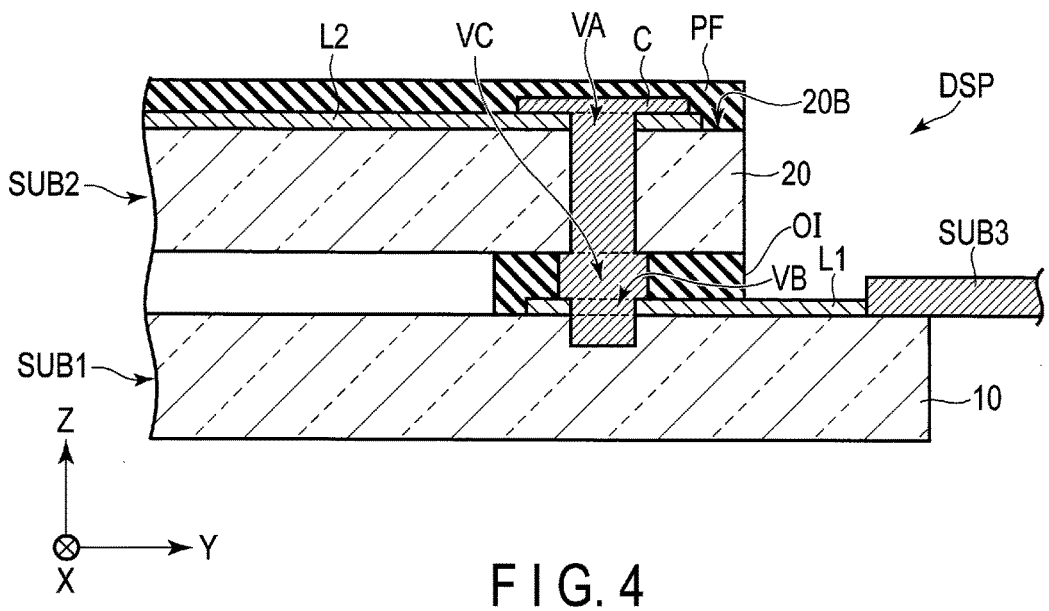
F I G. 4

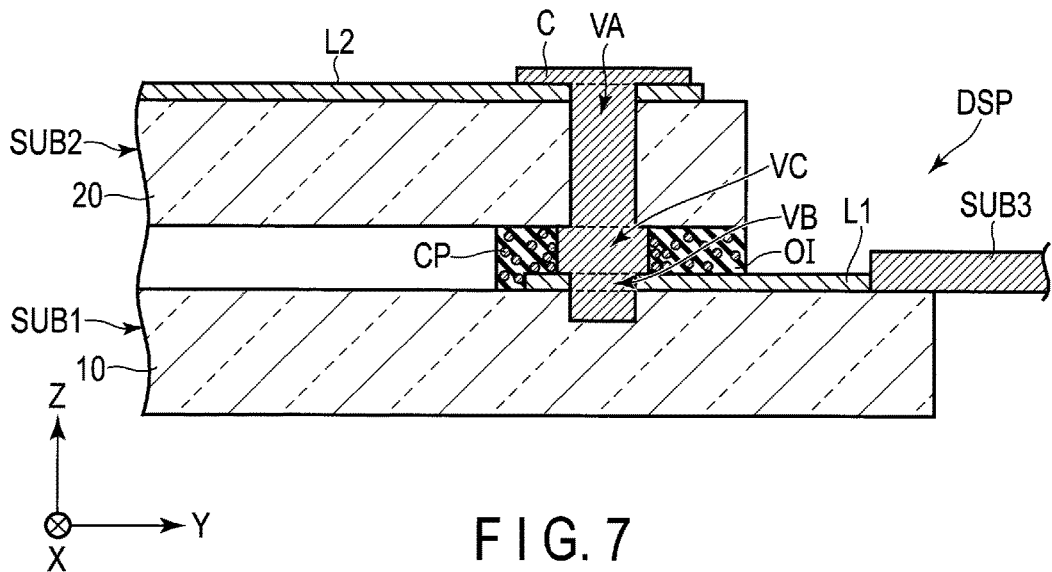
F I G. 7
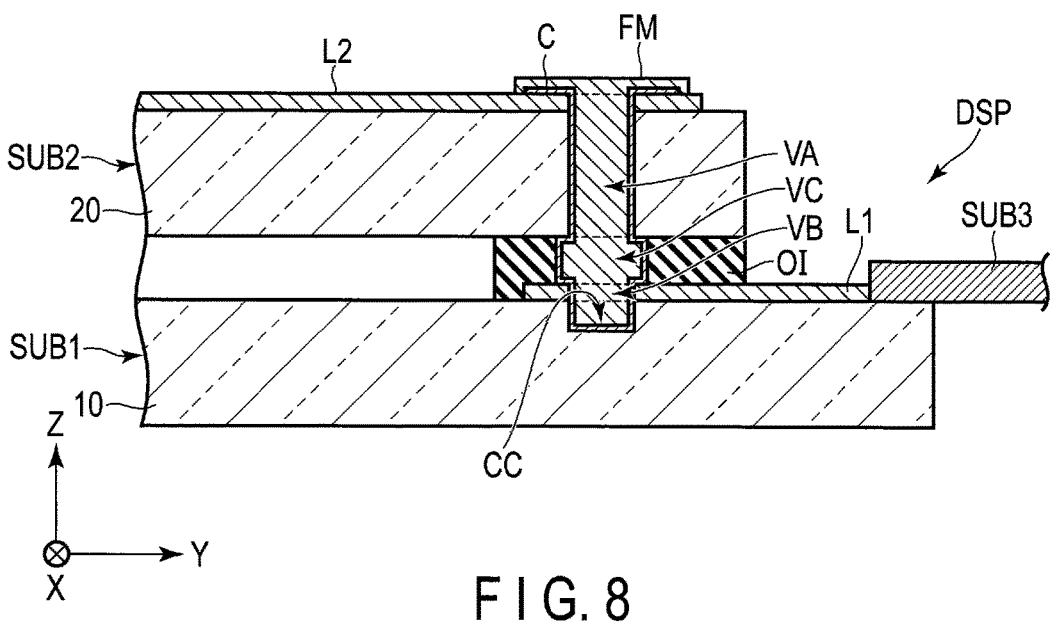
F I G. 8

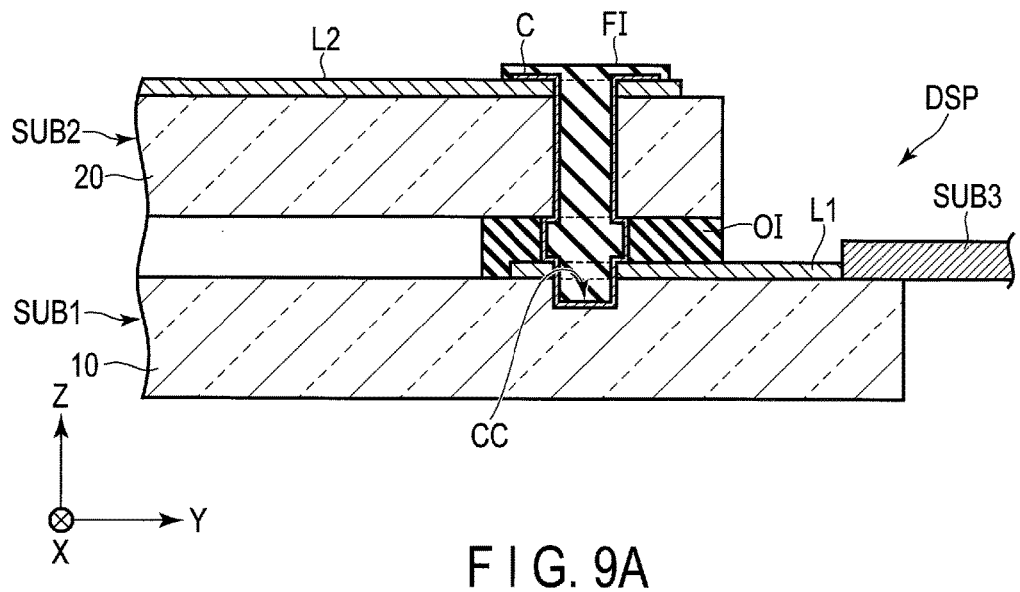
F I G. 9A
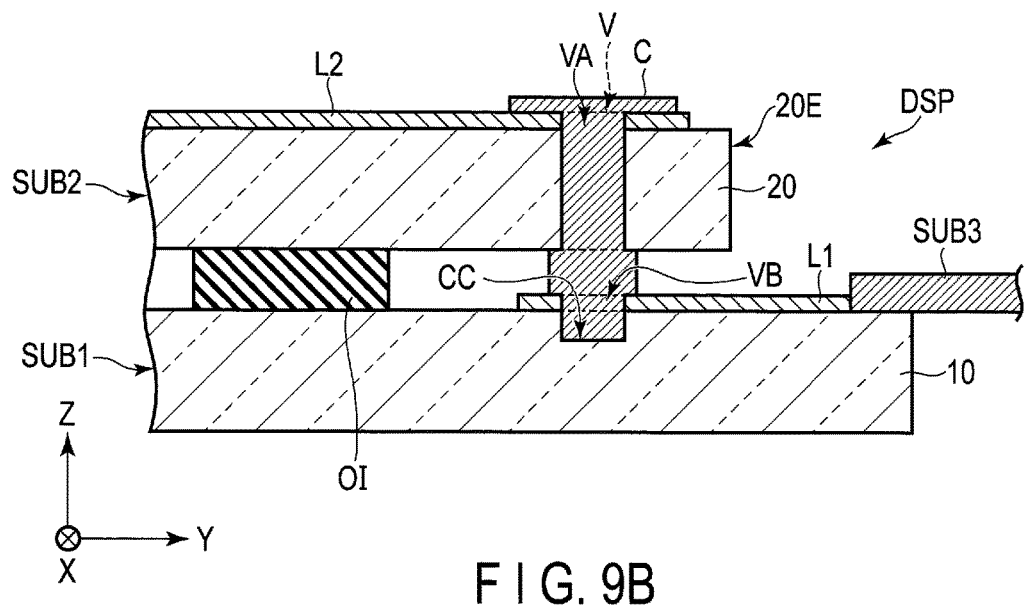
F I G. 9B

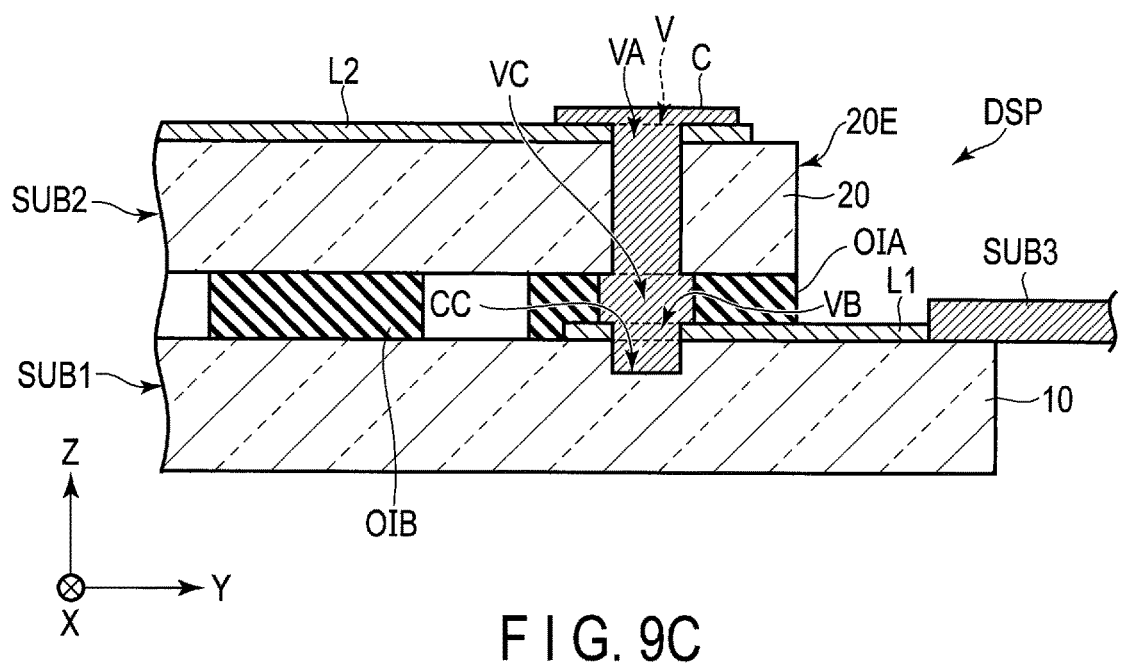
F I G. 9C

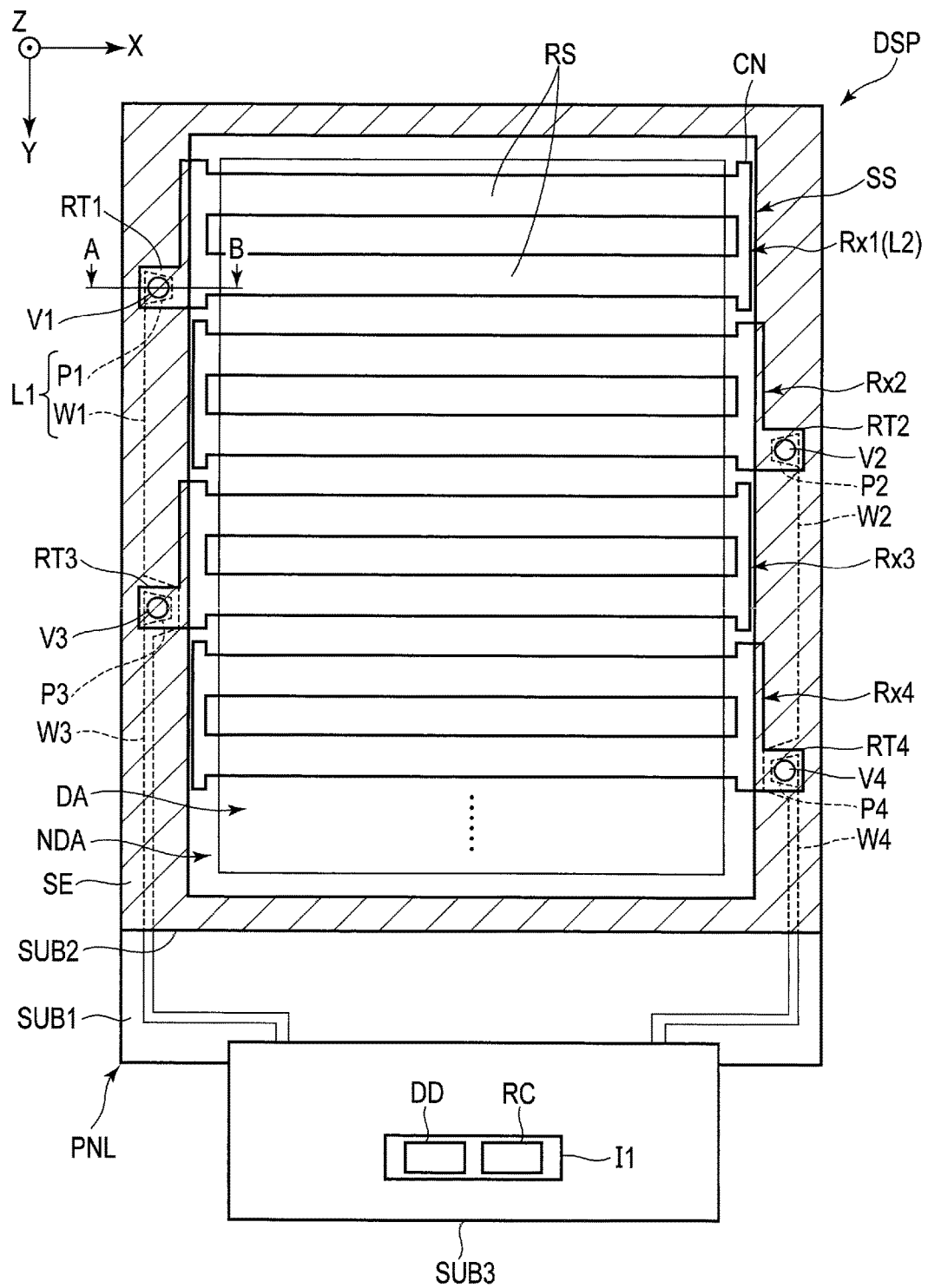
F I G. 10

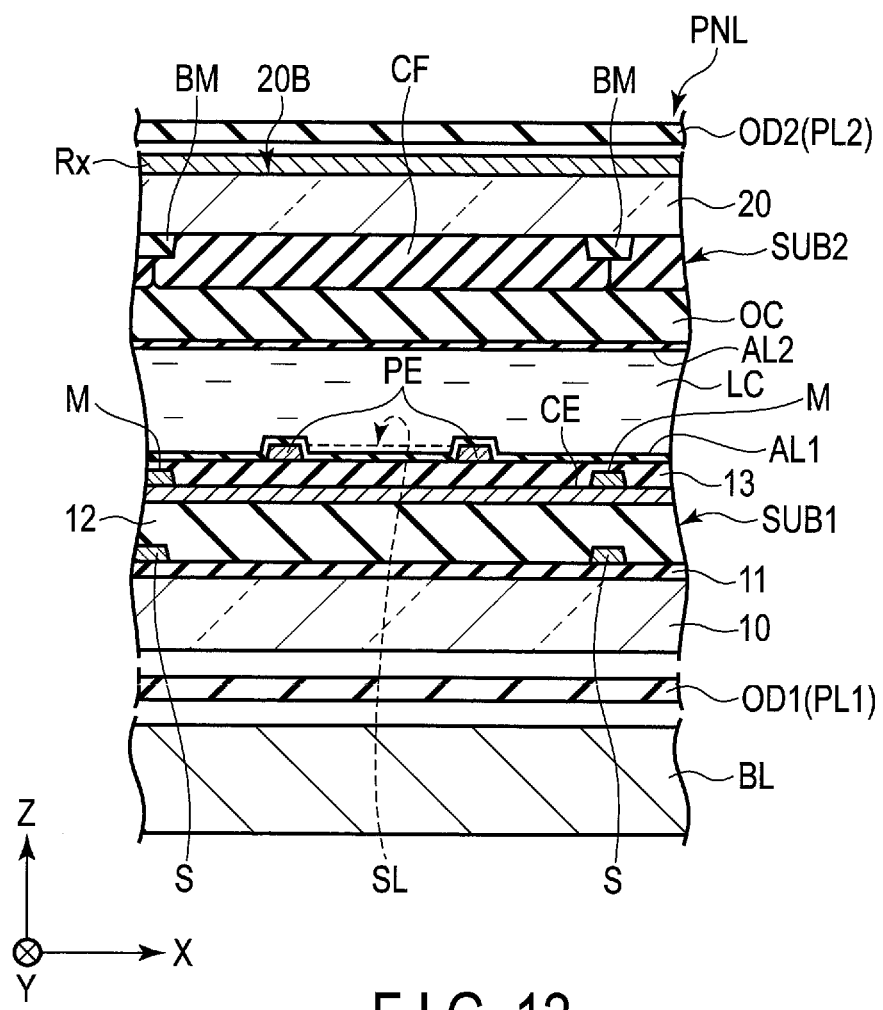
F I G. 12

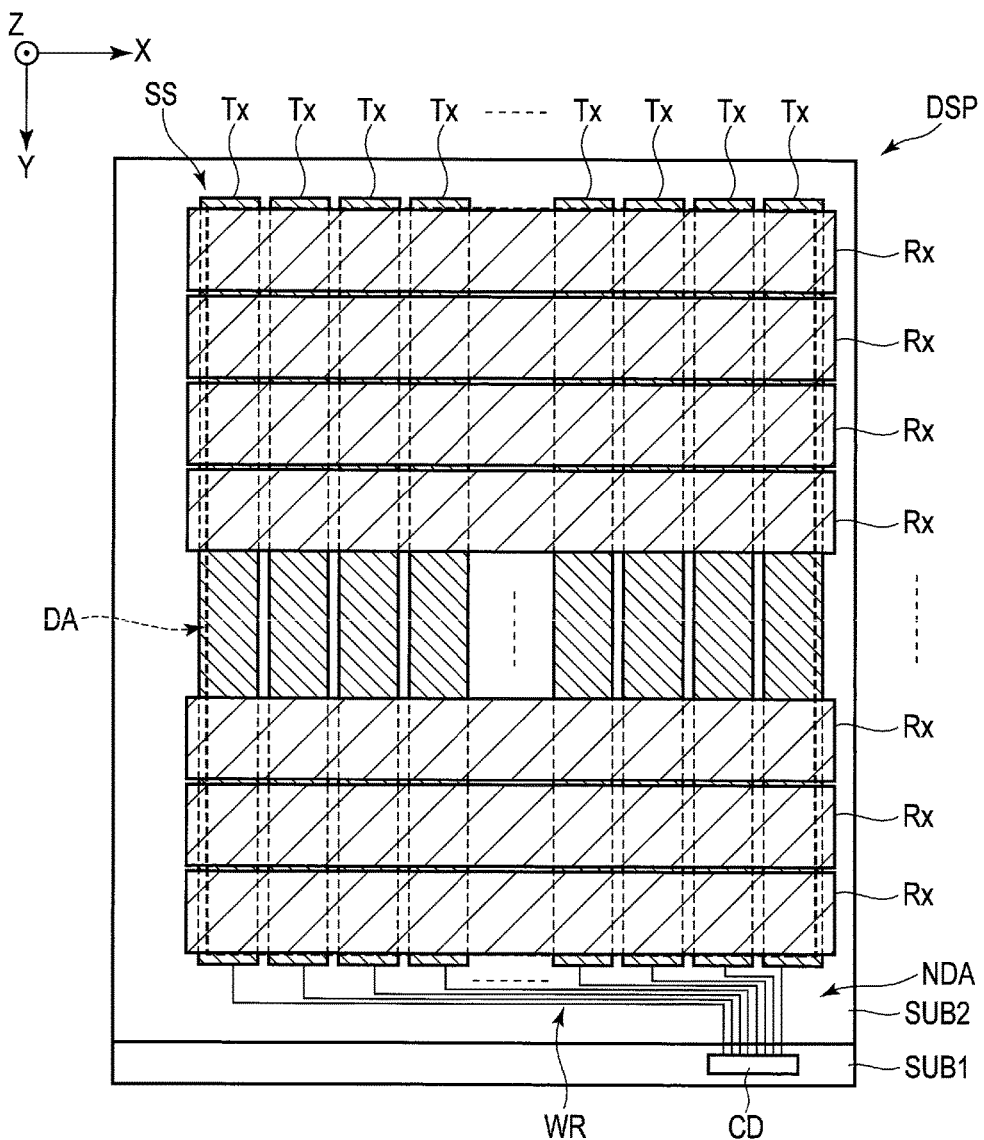
F I G. 13

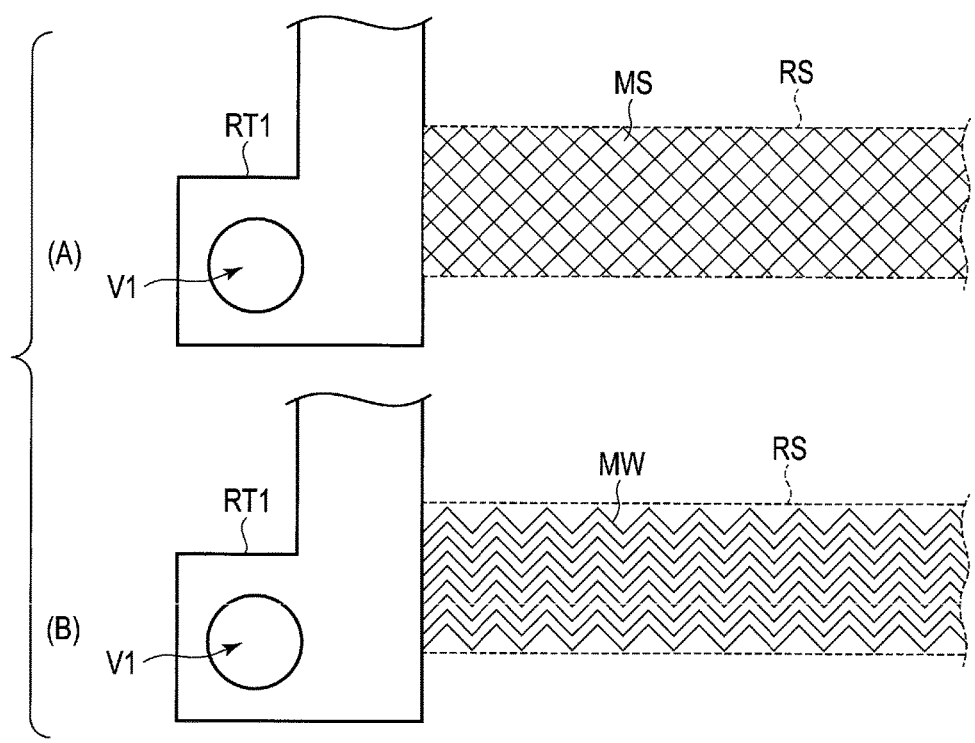
F I G. 15

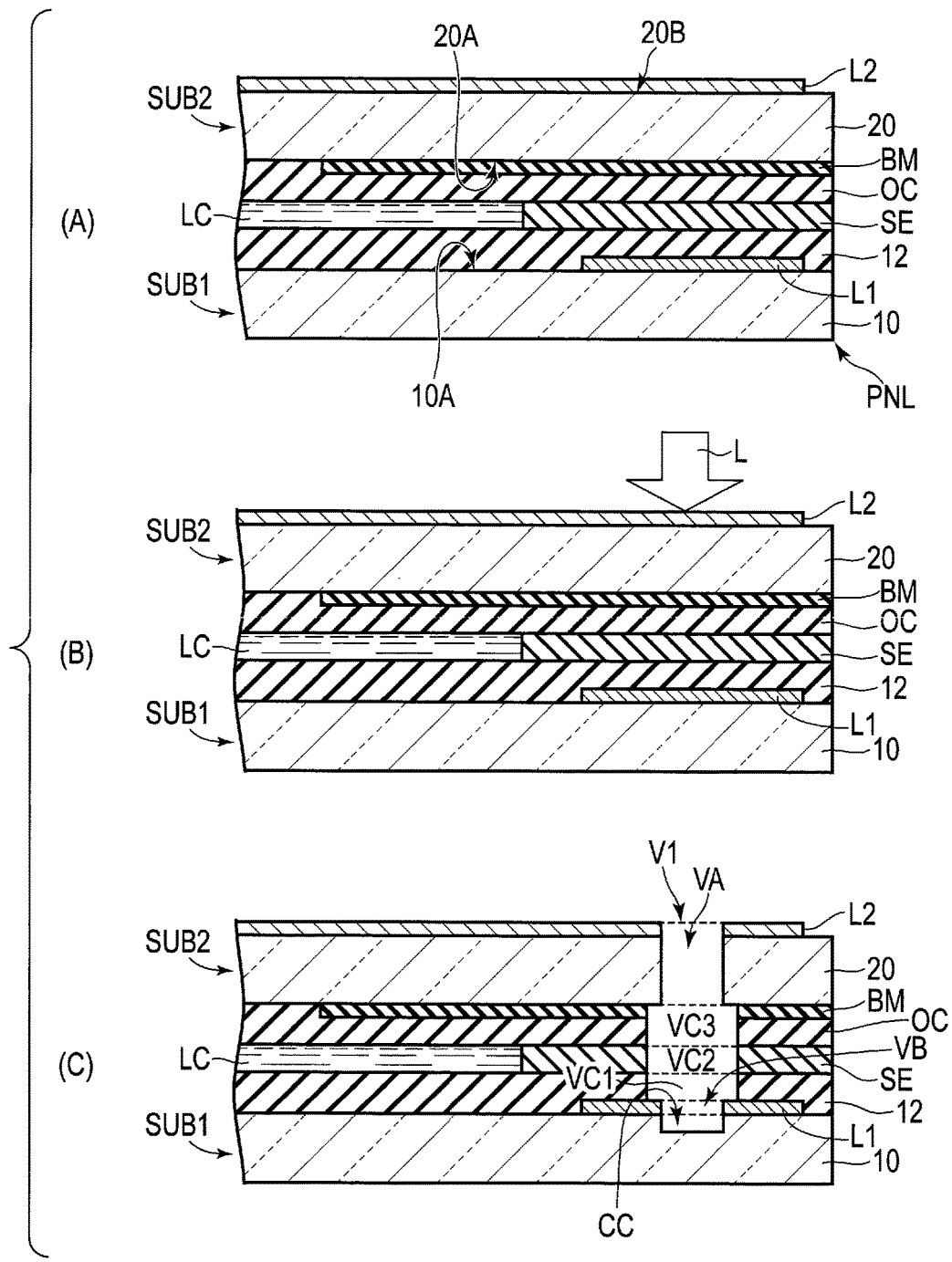
F I G. 17

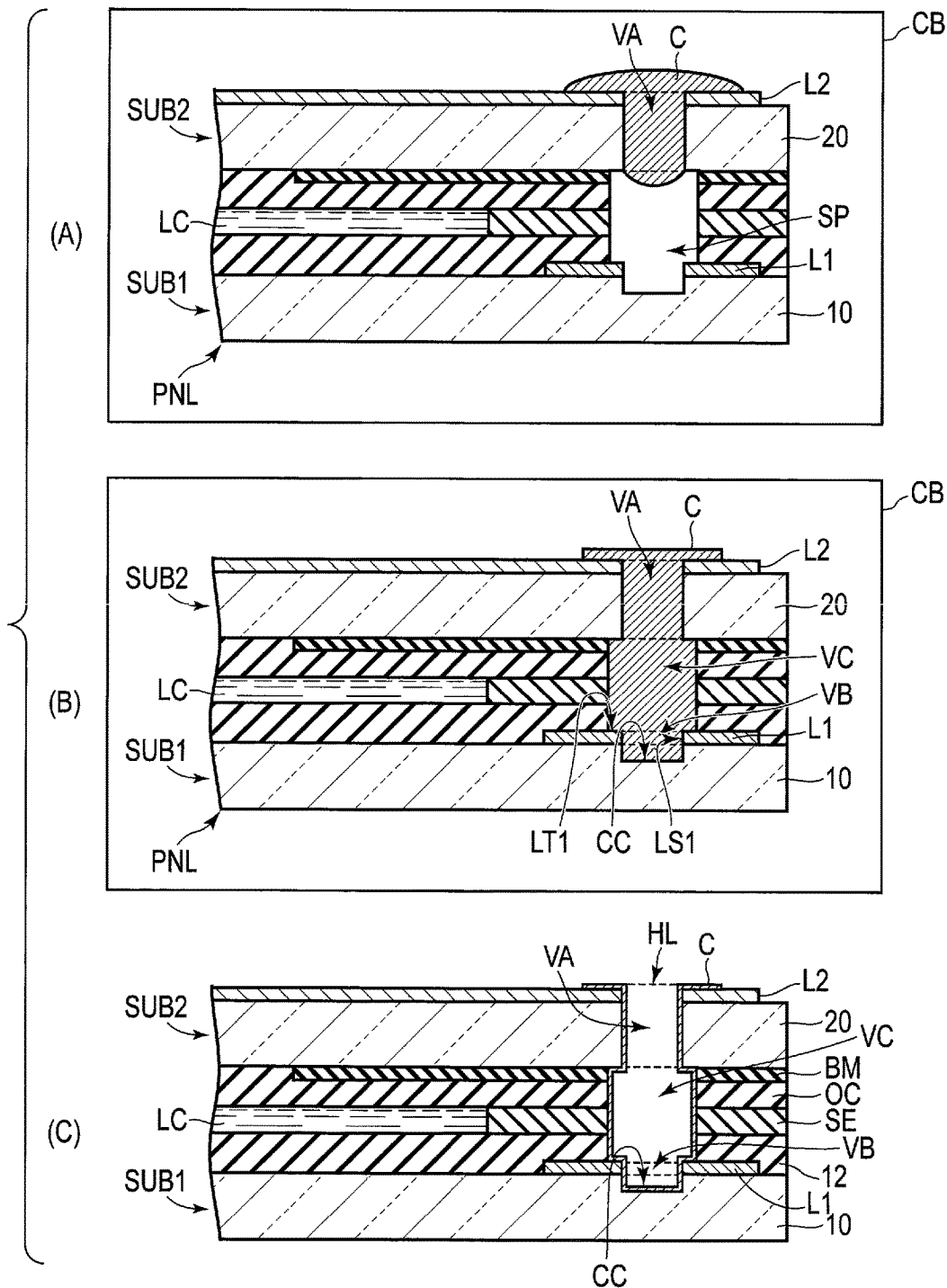
F I G. 18

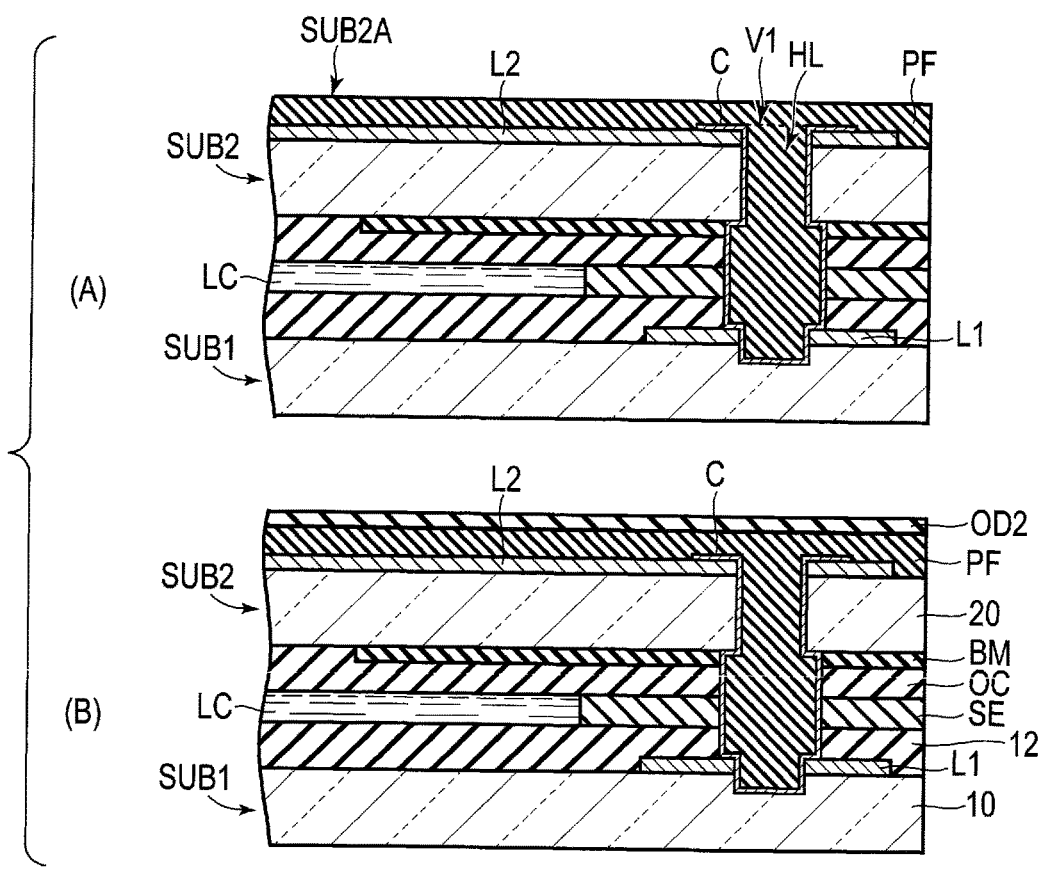
F I G. 19

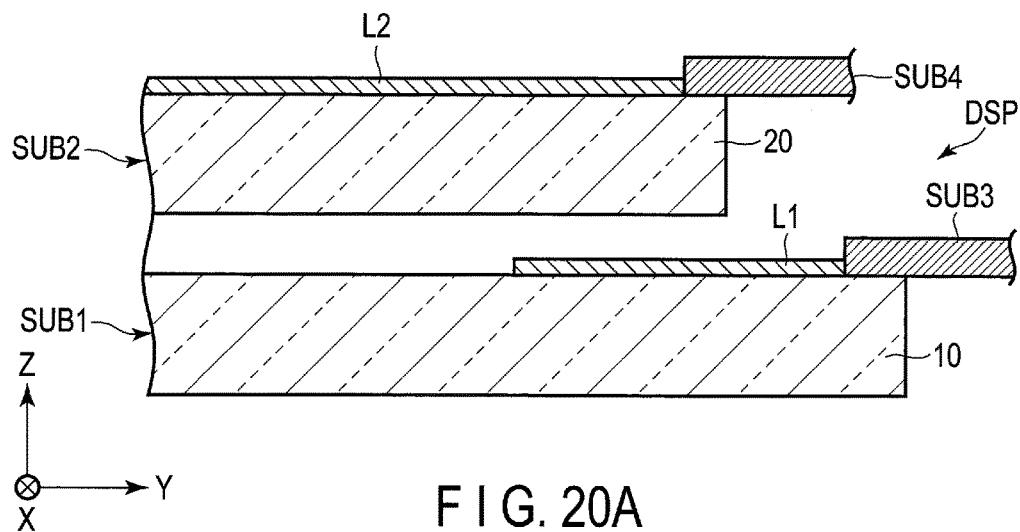
F I G. 20A
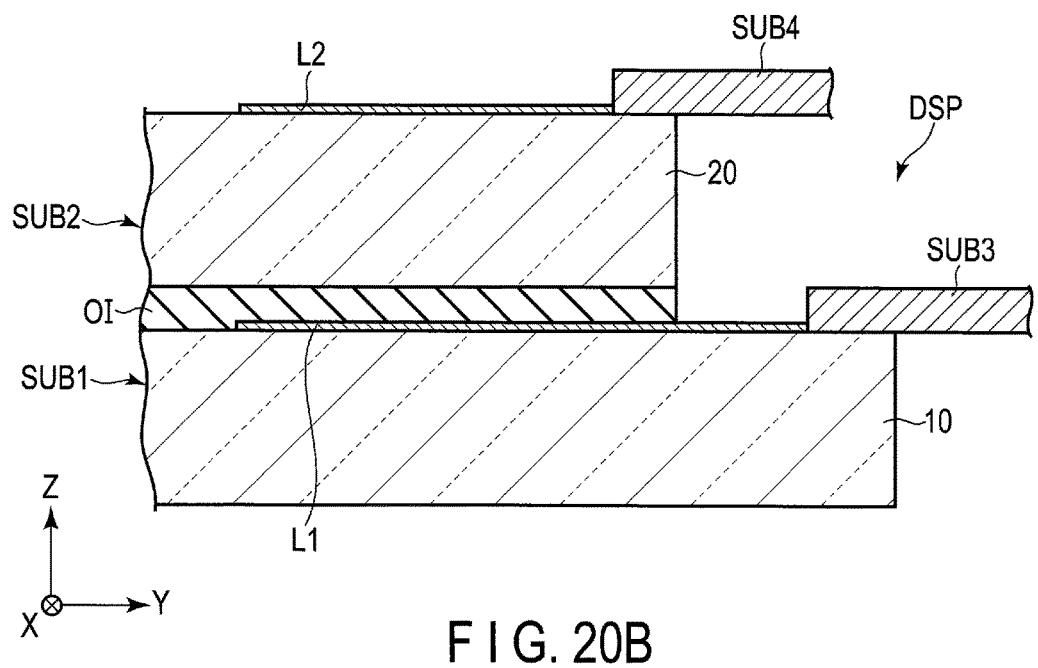
F I G. 20B

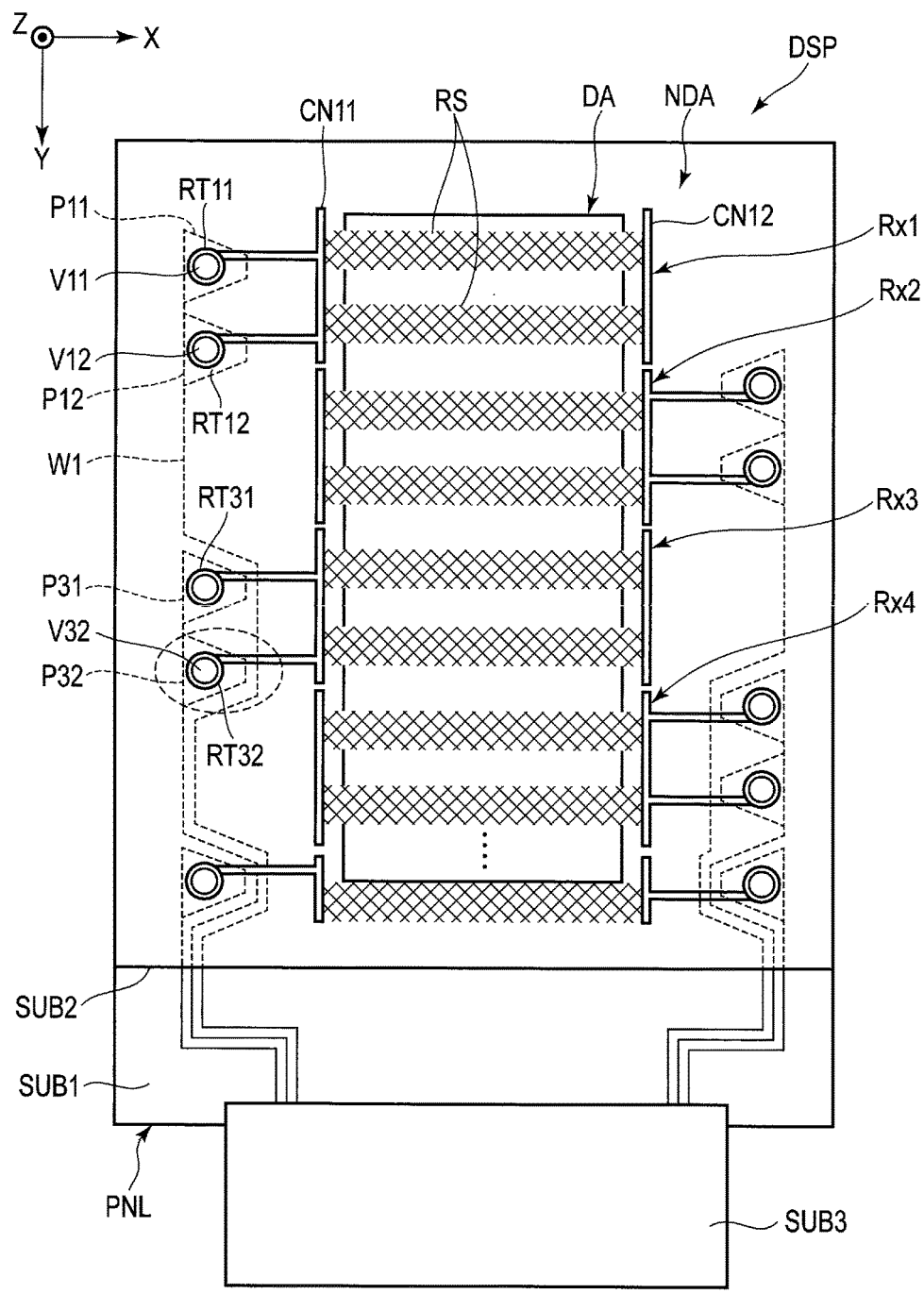
F I G. 21

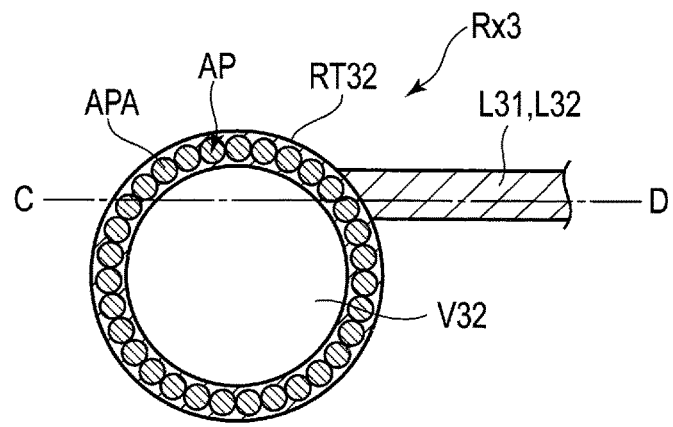
F I G. 22
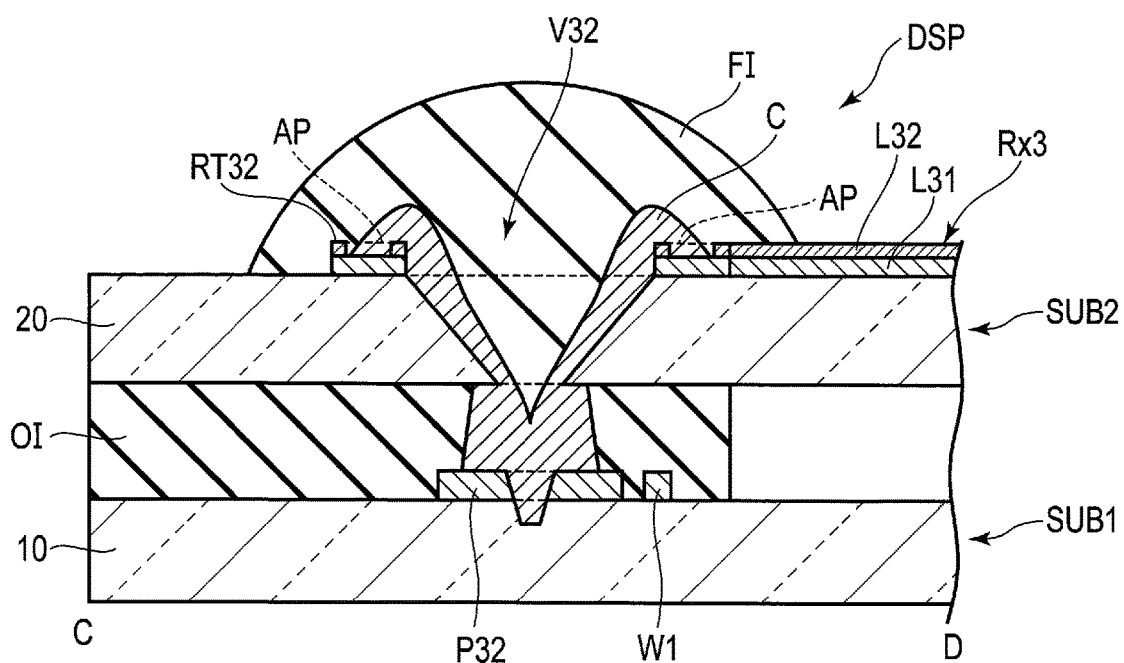
F I G. 23

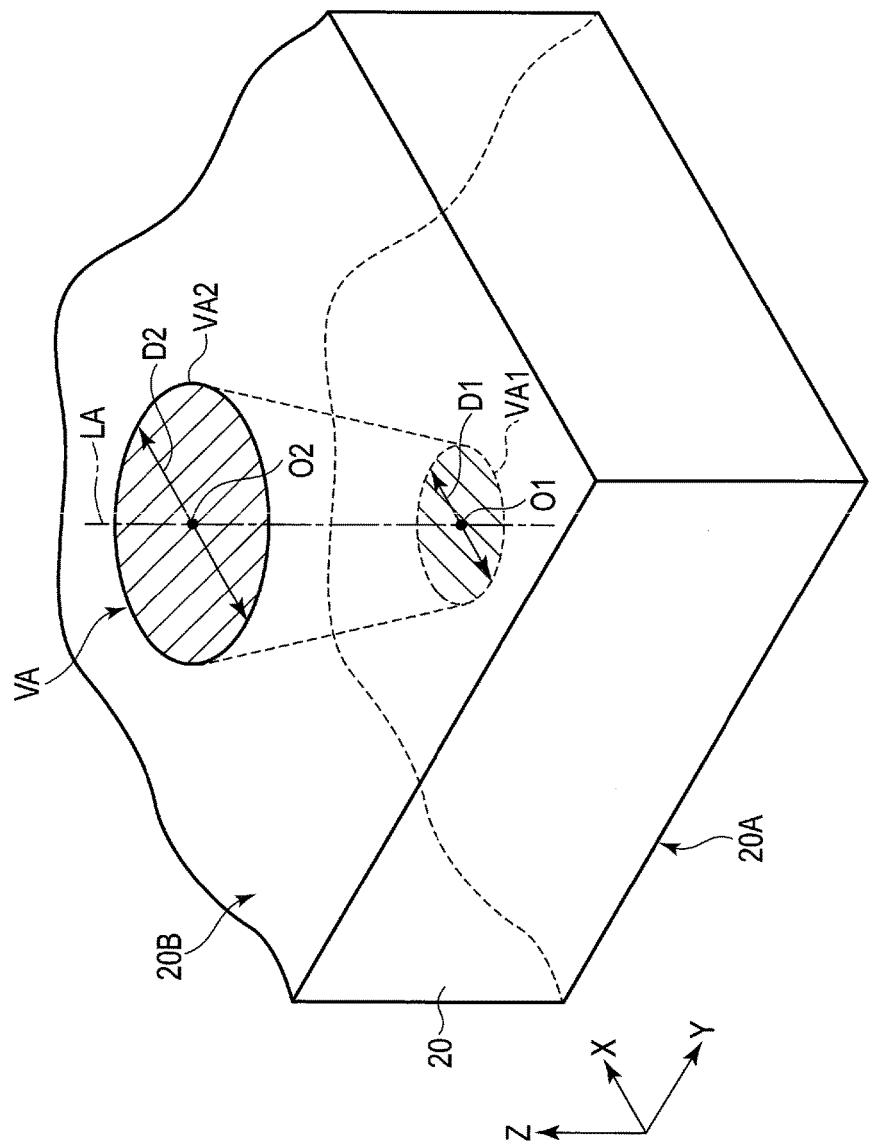
F I G. 27

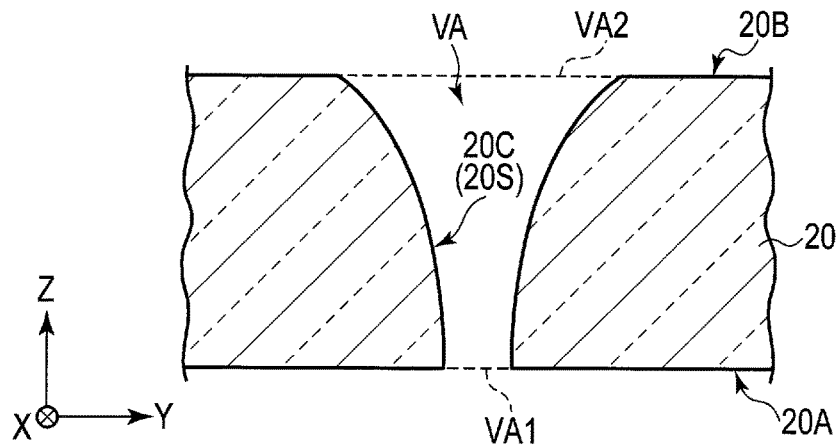
F I G. 28A
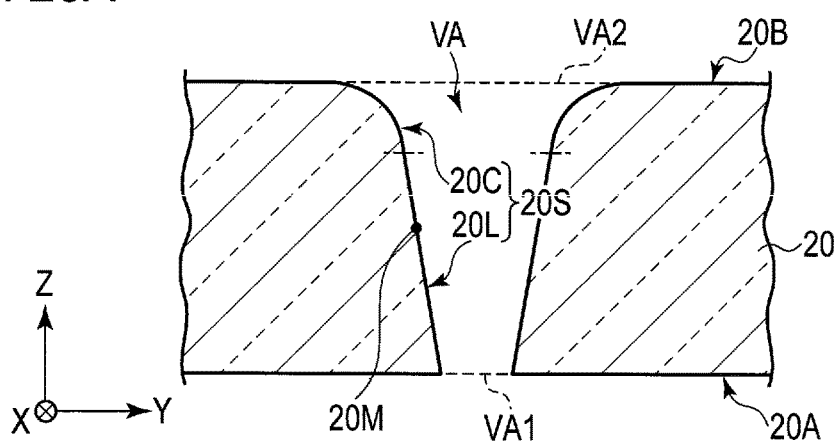
F I G. 28B
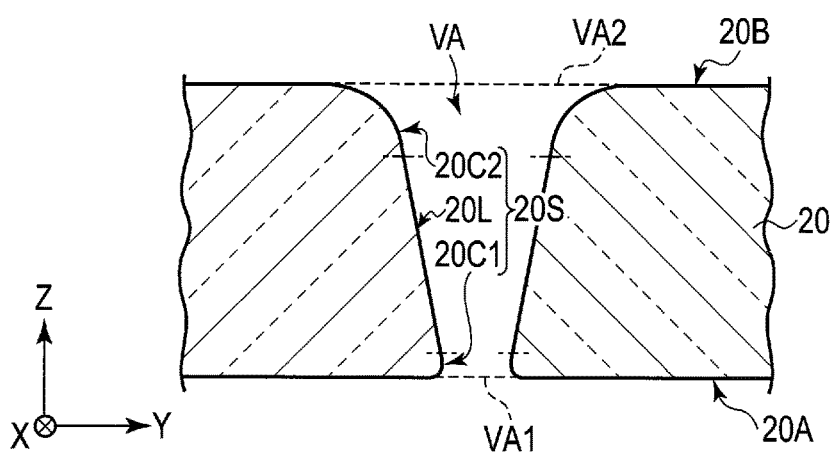
F I G. 28C

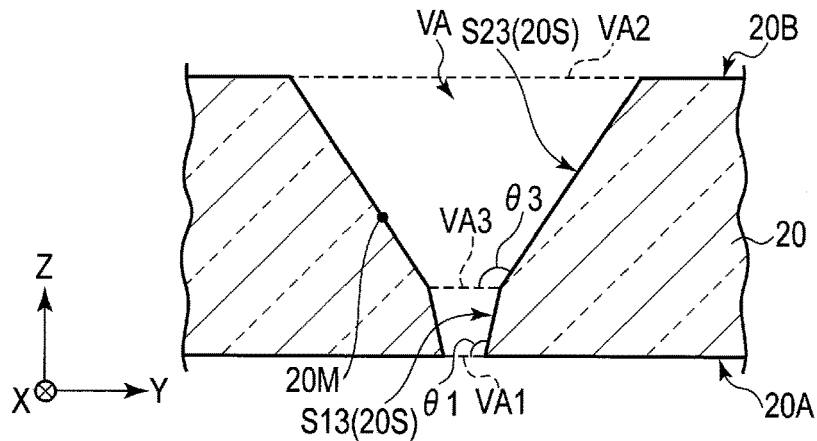
F I G. 29A
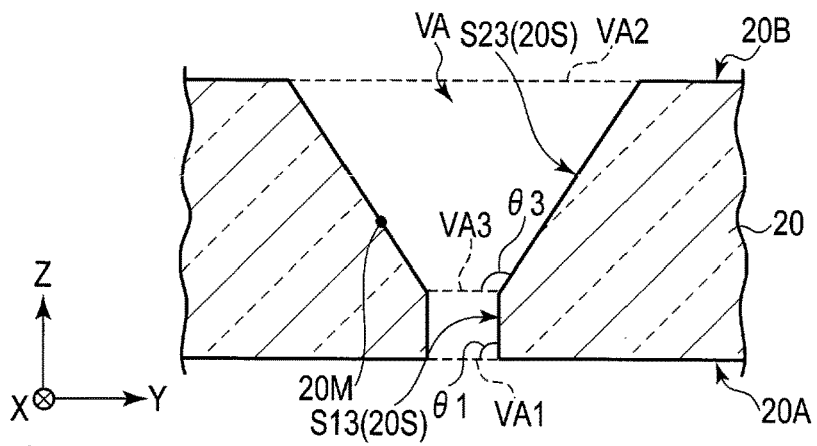
F I G. 29B
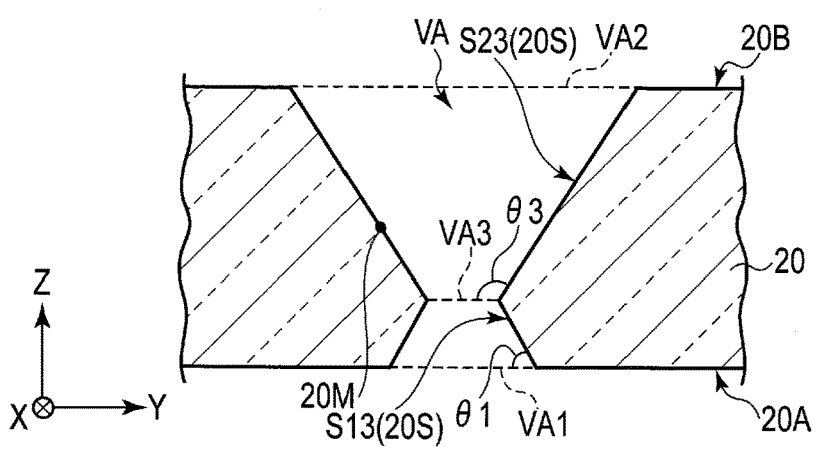
F I G. 29C

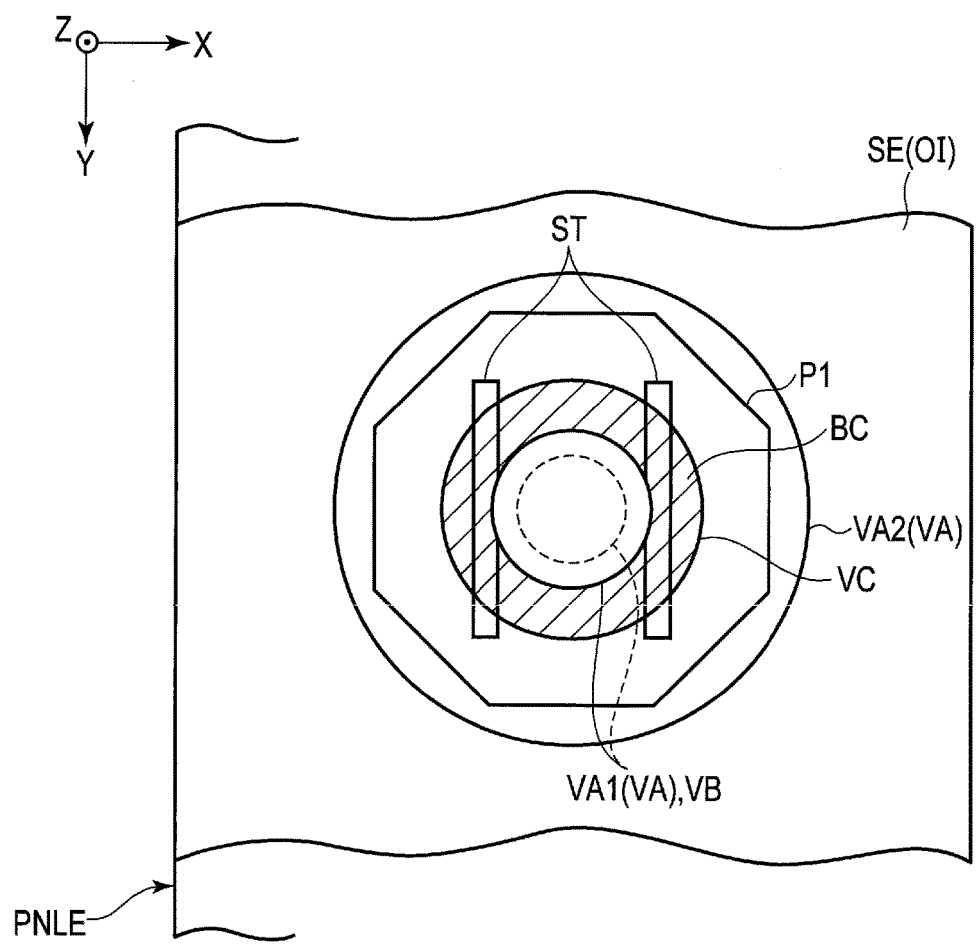
F I G. 30

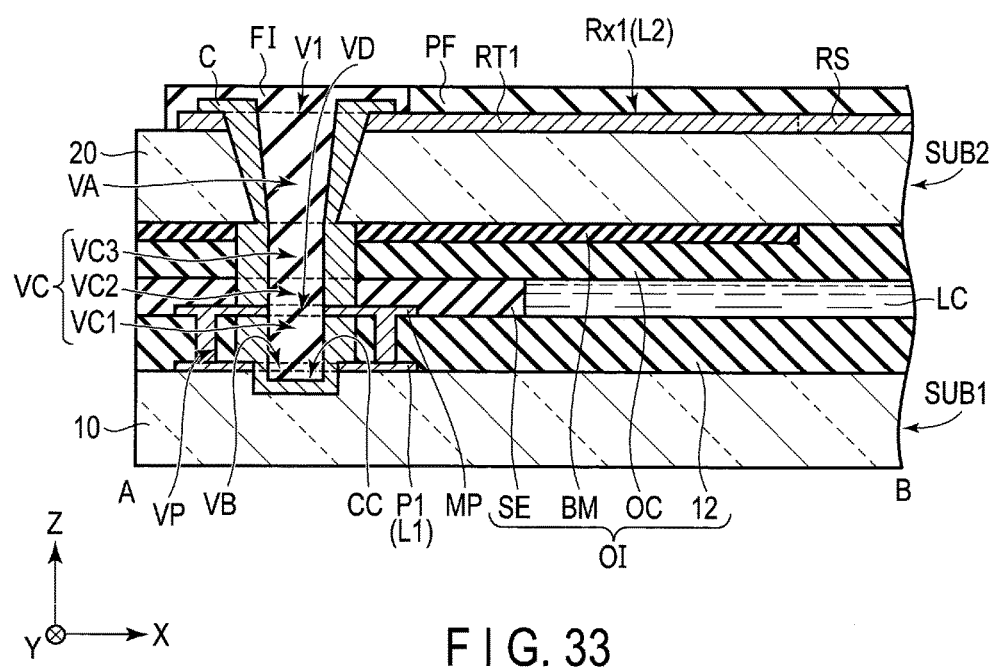
F I G. 33

ELECTRONIC APPARATUS AND MANUFACTURING METHOD OF THE SAME

CROSS-REFERENCE TO RELATED APPLICATIONS

This application is based upon and claims the benefit of priority from Japanese Patent Applications No. 2016-149571, filed Jul. 29, 2016; No. 2016-149572, filed Jul. 29, 2016; No. 2016-149605, filed Jul. 29, 2016; and No. 2017-121427, filed Jun. 21, 2017, the entire contents of all of which are incorporated herein by reference.

FIELD

Embodiments described herein relate generally to an electronic apparatus and a method of manufacturing the same.

BACKGROUND

Recently, technologies for narrowing the frame of a display device have been considered variously. In one example, a technology of electrically connecting a wiring portion including an in-hole connector at an interior of a hole which penetrates an inner surface and an outer surface of a first substrate made of resin with a wiring portion provided on an inner surface of a second substrate made of resin by an intersubstrate connector has been disclosed.

SUMMARY

The present disclosure relates generally to an electronic apparatus and a method of manufacturing the same. According to one embodiment, an electronic apparatus includes a first substrate including a first basement and a first conductive layer, a second substrate including a second basement, which is opposed to the first conductive layer and is separated from the first conductive layer, a second conductive layer, and a first hole penetrating the second basement, and a connecting material which electrically connects the first conductive layer and the second conductive layer via the first hole. Additional features and advantages are described herein, and will be apparent from the following Detailed Description and the figures.

BRIEF DESCRIPTION OF THE DRAWINGS

FIG. 3 is a cross-sectional view showing another configuration example of the display device DSP of the present embodiment.

FIG. 4 is a cross-sectional view showing another configuration example of the display device DSP of the present embodiment.

FIG. 7 is a cross-sectional view showing another configuration example of the display device DSP of the present embodiment.

FIG. 8 is a cross-sectional view showing another configuration example of the display device DSP of the present embodiment.

FIG. 9A is a cross-sectional view showing another configuration example of the display device DSP of the present embodiment.

FIG. 9B is a cross-sectional view showing another configuration example of the display device DSP of the present embodiment.

FIG. 9C is a cross-sectional view showing another configuration example of the display device DSP of the present embodiment.

FIG. 10 is a plan view showing a configuration example of the display device DSP of the present embodiment.

FIG. 12 is a cross-sectional view showing the structure of a part of the display panel PNL illustrated in FIG. 10.

FIG. 13 is a plan view showing a configuration example of a sensor SS.

FIG. 15 is an illustration showing a configuration example of a detector RS of a detection electrode Rx1 shown in FIGS. 10 and 14.

FIG. 17 is an illustration for explaining a method of manufacturing the display device DSP of the present embodiment.

FIG. 18 is an illustration for explaining a method of manufacturing the display device DSP of the present embodiment.

FIG. 19 is an illustration for explaining a method of manufacturing the display device DSP of the present embodiment.

FIG. 20A is a cross-sectional view showing comparative example 1.

FIG. 20B is a cross-sectional view showing comparative example 2.

FIG. 21 is a plan view showing a first modified example of the present embodiment.

FIG. 22 is a plan view showing a second modified example of the present embodiment.

FIG. 23 is a cross-sectional view of the display device DSP taken along line C-D including a terminal RT32 shown in FIG. 22.

FIG. 27 is a perspective view showing a configuration example of a first hole VA formed in a second basement 20.

FIG. 28A is a cross-sectional view showing another configuration example of the first hole VA.

FIG. 28B is a cross-sectional view showing yet another configuration example of the first hole VA.

FIG. 28C is a cross-sectional view showing yet another configuration example of the first hole VA.

FIG. 29A is a cross-sectional view showing yet another configuration example of the first hole VA.

FIG. 29B is a cross-sectional view showing yet another configuration example of the first hole VA.

FIG. 29C is a cross-sectional view showing yet another configuration example of the first hole VA.

FIG. 30 is a plan view showing a pad P1 illustrated in FIG. 10 in enlarged scale.

FIG. 33 is a cross-sectional view showing yet another configuration example of the display panel PNL.

DETAILED DESCRIPTION

Figure 1:
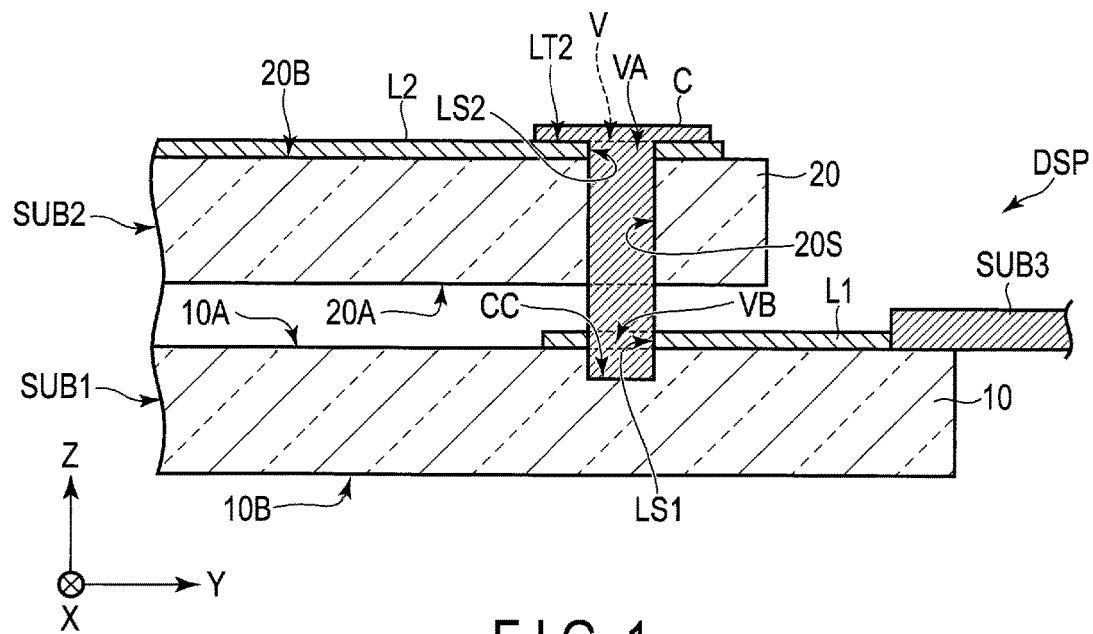
FIG. 1 is a cross-sectional view showing a configuration example of a display device DSP of the present embodiment.

In general, according to one embodiment, an electronic apparatus comprises: a first substrate comprising a first basement and a first conductive layer; a second substrate comprising: a second basement, which is opposed to the first conductive layer and is separated from the first conductive layer, a second conductive layer, and a first hole penetrating the second basement; and a connecting material which electrically connects the first conductive layer and the second conductive layer via the first hole.

According to another embodiment, an electronic apparatus includes a first substrate comprising a first basement and a first conductive layer, a second substrate comprising a second basement, which is opposed to the first conductive layer and is separated from the first conductive layer, and a second conductive layer, the second substrate including a first hole penetrating the second basement, and a connecting material which electrically connects the first conductive layer and the second conductive layer via the first hole, wherein the second conductive layer comprises a detector which detects touch or approach of an object in a first area, and a terminal connected to the detector in a second area adjacent to the first area, and the first hole is formed in the terminal.

According to yet another embodiment, a method of manufacturing an electronic apparatus, the method includes preparing a first substrate comprising a first basement and a first conductive layer, and a second substrate comprising a second basement and a second conductive layer, the second basement being opposed to the first conductive layer and being separated from the first conductive layer, irradiating a laser beam onto the second substrate and forming a first hole which penetrates the second basement, and forming a connecting material which electrically connects the first conductive layer and the second conductive layer via the first hole.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, and redundant detailed description thereof is omitted unless necessary.

In the present embodiment, a display device as an example of an electronic apparatus is disclosed. This display device can be used in various devices such as smartphones, tablet computers, mobile phones, notebook computers, and game consoles. Note that the main structures disclosed in the present embodiment are applicable to a liquid crystal display device, a self-luminous display device such as an organic electroluminescent display device, an electronic paper display device including a cataphoretic element, and the like, a display device to which micro-electromechanical systems (MEMS) is applied, or a display device to which electrochromism is applied.

First Embodiment: First Configuration Example

FIG. 1 is a cross-sectional view showing a first configuration example of a display device DSP of the present embodiment. While a first direction X, a second direction Y, and a third direction Z are orthogonal to each other, they may cross each other at an angle other than 90 degrees. The first direction X and the second direction Y correspond to directions parallel to a surface of a substrate which constitutes the display device DSP, and the third direction Z corresponds to a thickness direction of the display device DSP. The figure illustrates a partial cross-section of the display device DSP in a Y-Z plane defined by the second direction Y and the third direction Z.

The display device DSP comprises a first substrate SUB1, a second substrate SUB2, a connecting material C, and a wiring substrate SUB3. The first substrate SUB1 and the second substrate SUB2 are opposed to each other in the third direction Z. In the following explanation, a direction from the first substrate SUB1 toward the second substrate SUB2 is referred to as upward (or merely above), and a direction from the second substrate SUB2 toward the first substrate SUB1 is referred to as downward (or merely below). Further, a view from the second substrate SUB2 toward the first substrate SUB1 is called a planar view. Furthermore, a view of a cross-section of the display device DSP in the Y-Z plane shown in FIG. 1 (or an X-Z plane defined by the first direction X and the third direction Z, though not illustrated) is called a cross-sectional view.

The first substrate SUB1 comprises a first basement 10, and a first conductive layer L1 located on the first basement 10 at the side opposed to the second substrate SUB2. The first basement 10 includes a surface 10A opposed to the second substrate SUB2, and a surface 10B on a side opposite to the surface 10A. In the example illustrated, the first conductive layer L1 is located on the surface 10A. Further, although not illustrated in the figure, various insulating layers and various conductive layers may be disposed between the first basement 10 and the first conductive layer L1, and on the first conductive layer L1.

The second substrate SUB2 comprises a second basement 20, and a second conductive layer L2. The second basement 20 includes a surface 20A opposed to the first substrate SUB1, and a surface 20B on a side opposite to the surface 20A. With respect to the second basement 20, the surface 20A is opposed to the first conductive layer L1, and is separated from the first conductive layer L1 in the third direction Z. In the example illustrated, the second conductive layer L2 is located on the surface 20B. The first basement 10, the first conductive layer L1, the second basement 20, and the second conductive layer L2 are arranged in the third direction Z in this order. Although an air layer is located between the first conductive layer L1 and the second basement 20, an insulating layer may be located as described below, or a conductive layer in addition to the insulating layer may be located. Further, although not illustrated in the figure, various insulating layers and various conductive layers may be disposed between the second basement 20 and the second conductive layer L2, and on the second conductive layer L2. Various insulating layers and various conductive layers may also be disposed between the first substrate SUB1 and the second substrate SUB2.

The first basement 10 and the second basement 20 are formed of glass, for example, and more specifically, alkali-free glass. Also, each of the first basement 10 and the second basement 20 may be a resin substrate. The first conductive layer L1 and the second conductive layer L2 are formed of a metal material such as molybdenum, tungsten, titanium, aluminum, silver, copper, or chromium, an alloy formed of a combination of these metal materials, or a transparent conductive material such as indium tin oxide (ITO) or indium zinc oxide (IZO). They may have a single-layer structure or a multilayer structure. The connecting material C contains a metal material such as silver, and should preferably contain fine particles whose particle diameter is of the order of several nanometers to several tens of nanometers.

The wiring substrate SUB3 is mounted on the first substrate SUB1, and is electrically connected to the first conductive layer L1. Such a wiring substrate SUB3 is, for example, a flexible substrate having flexibility. It is sufficient if the flexible substrate applicable in the present embodiment comprises a flexible part formed of a bendable material in at least a part of the flexible substrate. For example, the wiring substrate SUB3 of the present embodiment may be a flexible substrate whose entirety is constituted as a flexible part, or a rigid flexible substrate comprising a rigid part formed of a hard material such as glass epoxy and a flexible part formed of a bendable material such as polyimide.

Here, a structure of connection between the first conductive layer L1 and the second conductive layer L2 of the present embodiment will be described in detail. In the second substrate SUB2, the second basement 20 includes a first hole VA which is penetrated between the surface 20A and the surface 20B. In the example illustrated, the first hole VA also penetrates the second conductive layer L2. Meanwhile, in the first substrate SUB1, the first conductive layer L1 includes a second hole VB which is opposed to the first hole VA in the third direction Z. Also, the first basement 10 includes a concavity CC which is opposed to the second hole VB in the third direction Z. The concavity CC, the second hole VB, and the first hole VA are arranged in the third direction Z in this order. The concavity CC is formed from the surface 10A toward the surface 10B. However, in the example illustrated, the concavity CC is not penetrated to the surface 10B. In one example, a depth of the concavity CC along the third direction Z is approximately one fifth to half the thickness of the first basement 10 along the third direction Z. Note that the first basement 10 may include a hole which is penetrated between the surface 10A and the surface 10B instead of the concavity CC. The second hole VB and the concavity CC are both located directly under the first hole VA. The first hole VA, the second hole VB, and the concavity CC are located on the same straight line along the third direction Z, and form a contact hole V. Such a contact hole V is formed by irradiating a laser beam from the upper side of the second substrate SUB2 or by etching.

The connecting material C electrically connects the first conductive layer L1 and the second conductive layer L2 via the first hole VA. In the example illustrated, the connecting material C is in contact with each of an upper surface LT2 of the second conductive layer L2, an inner surface LS2 of the second conductive layer L2 in the first hole VA, and an inner surface 20S of the second basement 20 in the first hole VA, in the second substrate SUB2. The inner surfaces LS2 and 20S form an inner surface of the first hole VA. Also, the connecting material C is in contact with each of an inner surface LS1 of the first conductive layer L1 in the second hole VB, and the concavity CC, in the first substrate SUB1. The inner surface LS1 forms an inner surface of the second hole VB. In the example illustrated, although the connecting material C is filled to fill the first hole VA, the second hole VB, and the concavity CC, it suffices that the connecting material C is provided on at least the inner surfaces of these holes and concavity. Such a connecting material C is continuously formed between the first conductive layer L1 and the second conductive layer L2 without a break.

Thereby, the second conductive layer L2 is electrically connected to the wiring substrate SUB3 via the connecting material C and the first conductive layer L1. Accordingly, a control circuit for writing a signal to the second conductive layer L2 or reading a signal output from the second conductive layer L2 can be connected to the second conductive layer L2 via the wiring substrate SUB3.

FIG. 20A is a cross-sectional view showing comparative example 1. In comparative example 1, the second conductive layer L2 is not connected to the first conductive layer L1. Consequently, a wiring substrate SUB4 which is connected to the second conductive layer L2 is required for writing a signal to the second conductive layer L2 or reading a signal output from the second conductive layer L2. In other words, in comparative example 1, the wiring substrate SUB4 mounted on the second substrate SUB2 is required in addition to the wiring substrate SUB3 mounted on the first substrate SUB1.

FIG. 20B is a cross-sectional view showing comparative example 2. Comparative example 2 is different from comparative example 1 in that an organic insulating layer OI is provided between the first substrate SUB1 and the second substrate SUB2.

As compared to comparative example 1 (FIG. 20A) in which the wiring substrate SUB4 is mounted on the second substrate SUB2, in addition to the wiring substrate SUB3 mounted on the first substrate SUB1, and comparative example 2 (FIG. 20B), according to the present embodiment, there is no need to mount the wiring substrate SUB4 shown in FIGS. 20A and 20B on the second substrate SUB2 in order to connect the second conductive layer L2 and the control circuit. Further, a terminal for mounting the wiring substrate SUB4, and a conductive line for connecting the second conductive layer L2 and the wiring substrate SUB4 are also unnecessary. Accordingly, in an X-Y plane defined by the first direction X and the second direction Y, not only can the size of the second substrate SUB2 be reduced, but the width of a periphery of the display device DSP can be reduced. Moreover, the cost of an unnecessary element, i.e., the wiring substrate SUB4, can be reduced. Consequently, achieving a narrower frame structure and cost reduction is enabled.

Next, other configuration examples of the present embodiment will be described with reference to FIGS. 2 to 9C.

Second Configuration Example

Figure 2:
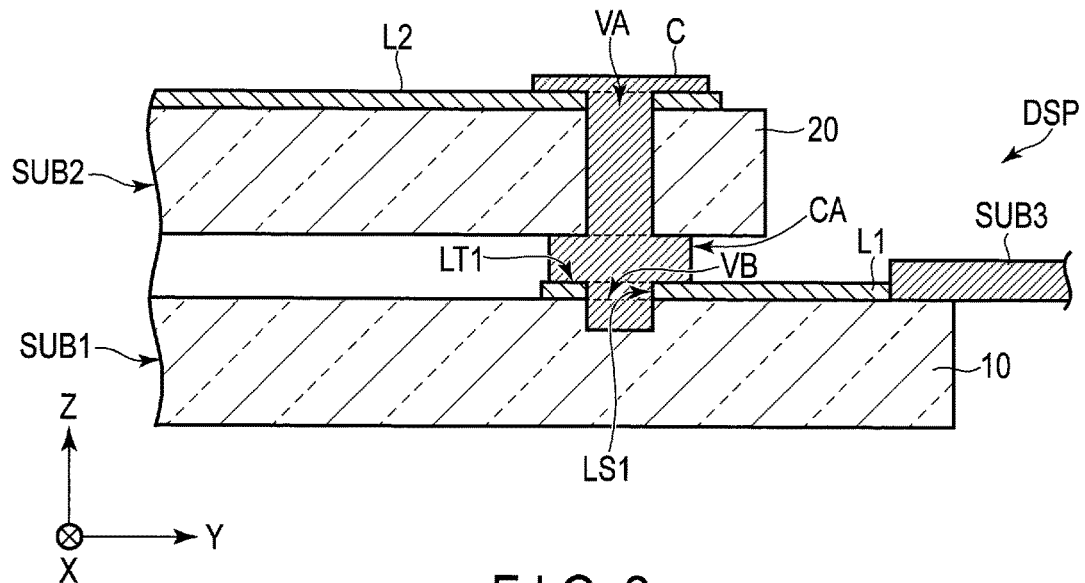
FIG. 2 is a cross-sectional view showing another configuration example of the display device DSP of the present embodiment.

A second configuration example shown in FIG. 2 is different from the first configuration example shown in FIG. 1 in that the connecting material C is in contact with an upper surface LT1 of the first conductive layer L1. More specifically, the connecting material C includes a side surface CA located between the first substrate SUB1 and the second substrate SUB2. The side surface CA is located more to the outer side than a position overlapping the first hole VA and the second hole VB. In the example illustrated, the side surface CA is located between the first conductive layer L1 and the second basement 20.

Also in the second configuration example as described above, the same advantages as those of the first configuration example can be obtained. In addition, since the connecting material C contacts not only the inner surface LS1 of the first conductive layer L1 in the second hole VB but also the upper surface LT1 of the first conductive layer L1, it is possible to increase an area of contact of the connecting material C with the first conductive layer L1, and suppress poor connection between the connecting material C and the first conductive layer L1.

Third Configuration Example

A third configuration shown in FIG. 3 is different from the second configuration example shown in FIG. 2 in that the display device DSP comprises an organic insulating layer OI located between the first conductive layer L1 and the second basement 20, and the organic insulating layer OI includes a third hole VC connected to the first hole VA and the second hole VB. The organic insulating layer OI in the above includes, for example, a second insulating layer, a light-shielding layer, a color filter, an overcoat layer, an alignment film, and a seal which adheres the first substrate SUB1 and the second substrate SUB2, which will be described later. Although an explanation will be provided later by referring to FIG. 12, a second insulating layer 12, a first alignment film AL1, and the like, are provided in the first substrate SUB1, and a light-shielding layer BM, a color filter CF, an overcoat layer OC, a second alignment film AL2, and the like, are provided in the second substrate SUB2. However, the organic insulating layer OI in the present embodiment is not necessarily formed of an organic insulating layer in the entirety, but may partially include an inorganic insulating layer.

The third hole VC is enlarged in the second direction Y as compared to the first hole VA and the second hole VB. Note that the third hole VC is enlarged in not only the second direction Y, but all directions in the X-Y plane as compared to the first hole VA and the second hole VB. The concavity CC, the second hole VB, the third hole VC, and the first hole VA are arranged in the third direction Z in this order. Although the organic insulating layer OI is in contact with the upper surface LT1 of the first conductive layer L1, in the third hole VC, a part of the upper surface LT1 is exposed.

The connecting material C is provided continuously in the first hole VA, the second hole VB, and the third hole VC, and electrically connects the first conductive layer L1 and the second conductive layer L2. The connecting material C is in contact with an inner surface OIS of the organic insulating layer OI, and is also in contact with each of the inner surface LS1 of the first conductive layer L1 and the upper surface LT1 of the first conductive layer L1 in the first substrate SUB1.

Also in the third configuration example as described above, the same advantages as those of the first configuration example can be obtained. In addition, since the connecting material C contacts the inner surface LS1 and the upper surface LT1 of the first conductive layer L1 in the third hole VC of the organic insulating layer OI, it is possible to increase an area of contact of the connecting material C with the first conductive layer L1, and suppress poor connection between the connecting material C and the first conductive layer L1.

Although an example in which the third hole VC is enlarged as compared to the first hole VA and the second hole VB has been described above, if sufficient conductivity can be obtained by the connecting material C and the first conductive layer L1, the diameter of the third hole VC may be the same as the diameter of each of the first hole VA and the second hole VB, or smaller than that of each of the first hole VA and the second hole VB in the X-Y plane.

Fourth Configuration Example

A fourth configuration example shown in FIG. 4 is different from the third configuration example shown in FIG. 3 in that the second substrate SUB2 is provided with a protection material PF which covers the second conductive layer L2 and the connection material C. In the example illustrated, the protection material PF also covers the surface 20B of the second basement 20. If the connecting material C is provided on the inner surfaces of the first hole VA, the second hole VB, and the third hole VC, but is not filled around a central part of each of these holes, the connecting material C includes a hollow portion. In such a case, the protection material PF may be filled in the hollow portion of the connecting material C. The protection material PF is formed of an organic insulating material such as acrylic resin.

Also in the fourth configuration example, the same advantages as above can be obtained. In addition, the second conductive layer L2 and the connecting material C can be protected.

Fifth Configuration Example

Figure 5:
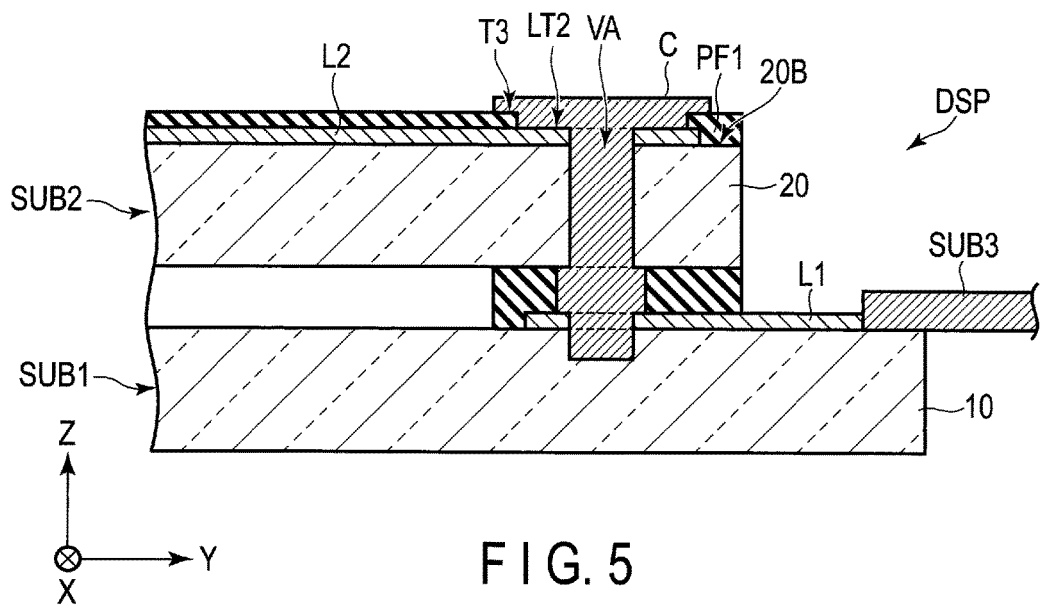
FIG. 5 is a cross-sectional view showing another configuration example of the display device DSP of the present embodiment.

A fifth configuration example shown in FIG. 5 is different from the third configuration example shown in FIG. 3 in that the second substrate SUB2 is provided with a protection material PF1 which covers the second conductive layer L2. In the example illustrated, although the second conductive layer L2 and the surface 20B of the second basement 20 are covered with the protection material PF1, a portion around the first hole VA of the second conductive layer L2 is not covered with the protection material PF1. The connecting material C is in contact with the upper surface LT2 of the second conductive layer L2 around the first hole VA, and also an upper surface T3 of the protection material PF1 in its periphery.

Also in the fifth configuration example, not only can the same advantages as above be obtained, but the second conductive layer L2 can be protected.

An example of a manufacturing method which can be applied to the fifth configuration example will be described.

In a first manufacturing method, after forming the protection material PF1 on the entire surface of the second substrate SUB2, the protection material PF1 is removed for an area slightly larger than an area in which the first hole VA is formed. While the protection material PF1 is formed of an organic insulating material in one example, it may be formed of an inorganic insulating material. As a method of removing the protection material PF1, a method of irradiating laser beams, or a method of patterning by using photolithographic technology can be applied. In removing the protection material PF1 formed of an organic insulating material, when the method of irradiating laser beams is applied, the protection material PF1 is removed for an area greater than an area irradiated with the laser beams. After that, the first hole VA is formed, and the connecting material C is formed. A formation example of the first hole VA and the connecting material C will be described later.

In a second manufacturing method, the protection material PF1 is selectively formed excluding an area slightly larger than an area in which the first hole VA is formed. After that, the first hole VA is formed, and the connecting material C is formed.

By applying such a manufacturing method, a step (a difference in level) is created between the second conductive layer L2 and the protection material PF1 around the first hole VA. Accordingly, when the connecting material C is formed in the first hole VA, the connecting material C does not easily protrude over the protection material PF1, whereby excessive spreading of the connecting material C can be suppressed.

Sixth Configuration Example

Figure 6:
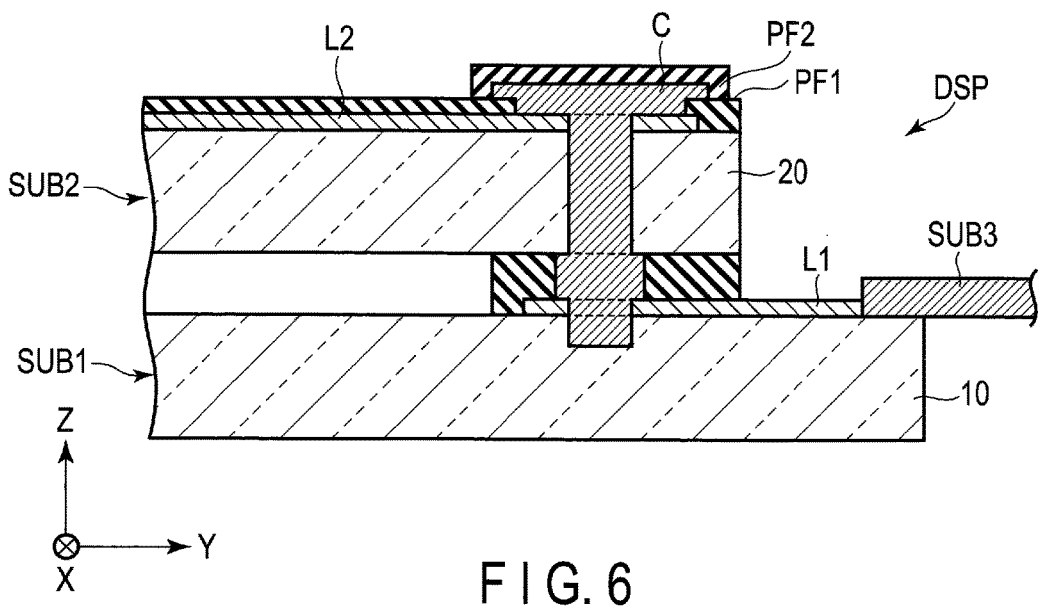
FIG. 6 is a cross-sectional view showing another configuration example of the display device DSP of the present embodiment.

A sixth configuration example shown in FIG. 6 is different from the fifth configuration example shown in FIG. 5 in that the second substrate SUB2 is provided with a protection material PF2 which covers the connection material C. In the example illustrated, the protection material PF2 is in contact with the protection material PF1 around the connecting material C. Note that the protection material PF2 may be filled in a hollow portion if the connecting material C includes the hollow portion. Further, the protection material PF2 may be provided not only in the periphery of the connecting material C, but disposed to cover the protection material PF1. Also in the sixth configuration example, not only can the same advantages as above be obtained, but the second conductive layer L2 and the connecting material C can be protected.

Seventh Configuration Example

A seventh configuration example shown in FIG. 7 is different from the third configuration example shown in FIG. 3 in that the organic insulating layer OI includes conductive particles CP at the inside. Also in the seventh configuration example, the same advantages as above can be obtained. In addition, since the conductive particles CP contact the connecting material C located in the third hole VC, even if the connecting material C has a discontinuity in the third hole VC, the discontinuous connecting materials C can be brought into conduction by the conductive particles CP, thereby improving the reliability.

Eighth Configuration Example

An eighth configuration example shown in FIG. 8 is different from the third configuration example shown in FIG. 3 in that the connecting material C is provided on the inner surface of each of the first hole VA, the second hole VB, the third hole VC, and the concavity CC, and a conductive filling material FM is filled in the hollow portion of the connecting material C. The filling material FM is obtained by curing a paste including conductive particles such as silver, for example. Also in the eighth configuration example, the same advantages as above can be obtained. In addition, even if the connecting material C has a discontinuity, the filling material FM can electrically connect the first conductive layer L1 and the second conductive layer L2, thereby improving the reliability. Also, a difference in level (i.e., a fall) in the third direction Z brought about by the hollow portion formed in the connecting material C can be moderated.

Ninth Configuration Example

A ninth configuration example shown in FIG. 9A is different from the eighth configuration example shown in FIG. 8 in that an insulating filling material FI is filled in the hollow portion of the connecting material C. The filling material FI is formed of an organic insulating material, for example. Also in the ninth configuration example, not only can the same advantages as above be obtained, but the connecting material C can be protected.

Tenth Configuration Example

A tenth configuration example shown in FIG. 9B is different from the third configuration example shown in FIG. 3 in that the contact hole V is formed at a position different from where the organic insulating layer OI is located. In the example illustrated, the contact hole V is located at a side closer to the wiring substrate SUB3 as compared to the organic insulating layer OI. More specifically, the contact hole V is located between the organic insulating layer OI and an end portion 20E of the second basement 20. The organic insulating layer OI includes, for example, a seal which adheres the first substrate SUB1 and the second substrate SUB2. Also in the tenth configuration example, the same advantages as above can be obtained.

Eleventh Configuration Example

An eleventh configuration example shown in FIG. 9C is different from the third configuration example shown in FIG. 3 in that an organic insulating layer OIB is provided between the first basement 10 and the second basement 20, in addition to an organic insulating layer OIA in which the contact hole V is provided. The organic insulating layer OIA is located between the organic insulating layer OIB and the end portion 20E of the second basement 20. The organic insulating layer OIB includes, for example, a seal which adheres the first substrate SUB1 and the second substrate SUB2. The organic insulating layer OIA includes, for example, various organic insulating layers provided in the first substrate SUB1, and various organic insulating layers provided in the second substrate SUB2. Also in the eleventh configuration example, the same advantages as above can be obtained.

Sensor-Equipped Display Device

FIG. 10 is a plan view showing a configuration example of the display device DSP according to the present embodiment. Here, as an example of the display device DSP, a liquid crystal display device on which a sensor SS is mounted will be described.

The display device DSP comprises a display panel PNL, an IC chip I1, the wiring substrate SUB3, etc. The display panel PNL is a liquid crystal display panel, and includes the first substrate SUB1, the second substrate SUB2, a seal SE, and a display function layer (a liquid crystal layer LC which will be described later). The second substrate SUB2 is opposed to the first substrate SUB1. The seal SE corresponds to a part indicated by hatching in FIG. 10, and the first substrate and the second substrate SUB2 are adhered to each other by the seal SE.

The display panel PNL includes a display area DA in which an image is displayed, and a frame-shaped non-display area NDA surrounding the display area DA. The display area DA corresponds to a first area, for example, and is located at an inner side surrounded by the seal SE. The non-display area NDA corresponds to a second area adjacent to the display area (first area), for example. The seal SE is located at the non-display area NDA.

The IC chip I1 is mounted on the wiring substrate SUB3. Note that the position of the IC chip I1 is not limited to the example illustrated. That is, the IC chip I1 may be mounted on the first substrate SUB1 which extends to the outer side of the second substrate SUB2, or mounted on an external circuit board connected to the wiring substrate SUB3. In the IC chip 1I, a display driver DD which outputs a signal necessary for displaying an image, for example, is incorporated. The display driver DD described in this specification includes at least a part of a signal line drive circuit SD, a scanning line drive circuit GD, and a common electrode drive circuit CD, which will be described later. Also, in the example illustrated, a detection circuit RC which functions as a touch panel controller, for example, is incorporated in the IC chip I1. The detection circuit RC may be incorporated in the other IC chip different from the IC chip I1.

The display panel PNL may be any of a transmissive display panel having a transmissive display function of displaying an image by selectively transmitting light from the lower part of the first substrate SUB1, a reflective display panel having a reflective display function of displaying an image by selectively reflecting light from the upper part of the second substrate SUB2, and a transflective display panel including both the transmissive display function and the reflective display function, for example.

The sensor SS is configured to perform sensing for detecting touch or approach of an object to the display device DSP. The sensor SS comprises a plurality of detection electrodes Rx (Rx1, Rx2, . . . , etc.). The detection electrodes Rx are provided in the second substrate SUB2, and corresponds to the above-described second conductive layer L2. The detection electrodes Rx extend in the first direction X, and are arranged to be spaced apart from each other in the second direction Y. While FIG. 10 illustrates detection electrodes Rx1 to Rx4 as the detection electrodes Rx, detection electrode Rx1 is focused for explaining an example of the structure of the detection electrode.

More specifically, detection electrode Rx1 comprises a detector RS, a terminal RT1, and a connection CN.

The detector RS is located in the display area DA, and extends in the first direction X. In detection electrode Rx1, the detector RS is primarily used for sensing. In the example illustrated, although the detector RS is formed in a strip shape, more specifically, the detector RS is formed of an aggregate of fine metal wires as will be explained with reference to FIG. 15. Further, although a single detection electrode Rx1 of the present example comprises two detectors RS, the detection electrode may comprise three or more detectors RS, or only one detector RS.

The terminal RT1 is located on one end side of the non-display area NDA in the first direction X, and is connected to the detectors RS. The connection CN is located on the other end side of the non-display area NDA in the first direction X, and connects the detectors RS to each other. In FIG. 10, the one end side corresponds to the left side of the display area DA, and the other end side corresponds to the right side of the display area DA. The terminal RT1 is partly formed at a position where the terminal RT1 and the seal SE overlap one another in planar view.

Meanwhile, the first substrate SUB1 comprises a pad P1 and a conductive line W1 corresponding to the first conductive layer L1. The pad P1 and the conductive line W1 are located on the one end side of the non-display area NDA, and the pad P1 or the conductive line W1 and the seal SE overlap in planar view. The pad P1 is formed at a position where the pad P1 and the terminal RT1 overlap one another in planar view. Also, although the pad P1 is formed in a trapezoidal shape in one example, the pad P1 may be formed in a different polygonal shape or in a circular or elliptical shape. The conductive line W1 is connected to the pad P1, extends in the second direction Y, and is electrically connected to the detection circuit RC of the IC chip I1 via the wiring substrate SUB3.

The contact hole V1 is formed at a position where the terminal RT1 and the pad P1 are opposed to each other. Also, the contact hole V1 may penetrate the pad P1 as well as penetrating the second substrate SUB2 including the terminal RT1 and the seal SE. In the example illustrated, the contact hole V1 is circular in planar view. However, the shape is not limited to the example illustrated, and the contact hole V1 may be formed in the other shape such as an elliptical shape. As has been explained with reference to FIG. 1, etc., the connecting material C is provided in the contact hole V1. Consequently, the terminal RT1 and the pad P1 are electrically connected. More specifically, the detection electrode Rx1 provided in the second substrate SUB2 is electrically connected to the detection circuit RC via the wiring substrate SUB3 connected to the first substrate SUB1. The detection circuit RC reads a sensor signal output from the detection electrode Rx, and detects the presence or absence of touch or approach of the object and also position coordinates, etc., of the object.

In the example illustrated, terminals RT1, RT3, . . . , of the odd-numbered detection electrodes Rx1, Rx3, . . . , pads P1, P3, . . . , conductive lines W1, W3, . . . , and contact holes V1, V3, . . . are all located on the one end side of the non-display area NDA. Further, terminals RT2, RT4, . . . , of the even-numbered detection electrodes Rx2, Rx4, . . . , pads P2, P4, . . . , conductive lines W2, W4, . . . , and contact holes V2, V4, . . . are all located on the other end side of the non-display area NDA. According to such a layout, a width on the one end side and a width on the other end side of the non-display area NDA can be made uniform, which is suitable for achieving a narrower frame structure.

As illustrated in the drawing, in a layout in which the pad P3 is closer to the wiring substrate SUB3 than the pad P1, the conductive line W1 detours around the pad P3 on the inner side (that is, the side close to the display area DA), and is arranged next to the conductive line W3 on the inner side between the pad P3 and the wiring substrate SUB3. Similarly, the conductive line W2 detours around the pad P4 on the inner side, and is arranged next to the conductive line W4 on the inner side between the pad P4 and the wiring substrate SUB3.

Figure 11:
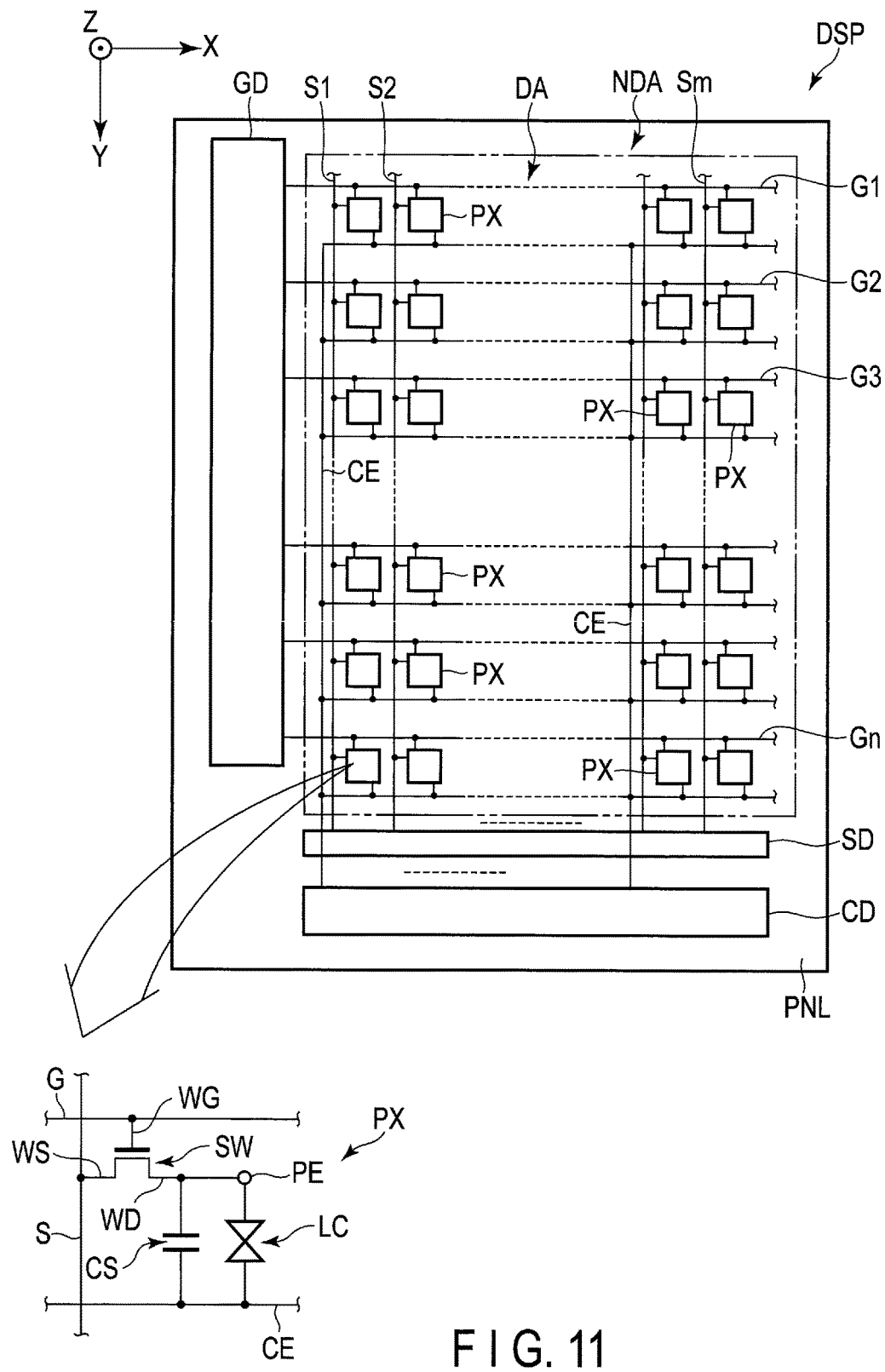
FIG. 11 is an illustration showing a basic structure and an equivalent circuit of the display panel PNL shown in FIG. 10.

FIG. 11 is an illustration showing a basic structure and an equivalent circuit of the display panel PNL shown in FIG. 10. The display panel PNL includes a plurality of pixels PX in the display area DA. Here, the pixel indicates a minimum unit which can be individually controlled in accordance with a pixel signal, and exists in, for example, an area including a switching element arranged at a position where a scanning line and a signal line, which will be described later, cross each other. The pixels PX are arrayed in a matrix in the first direction X and the second direction Y. Also, the display panel PNL includes scanning lines G (G1 to Gn), signal lines S (S1 to Sm), a common electrode CE, etc., in the display area DA. The scanning lines G extend in the first direction X, and are arranged in the second direction Y. The signal lines S extend in the second direction Y, and are arranged in the first direction X. Note that the scanning lines G and the signal lines S do not need to extend linearly but may be partially bent. The common electrode CE is disposed over the pixels PX. Each of the scanning lines the signal lines S, and the common electrode CE is drawn to the non-display area NDA. In the non-display area NDA, the scanning lines G are connected to the scanning line drive circuit GD, the signal lines S are connected to the signal line drive circuit SD, and the common electrode CE is connected to the common electrode drive circuit CD. The signal line drive circuit SD, the scanning line drive circuit GD, and the common electrode drive circuit CD may be formed on the first substrate SUB1, or a part or a whole of these circuits may be incorporated in the IC chip I1 shown in FIG. 10.

Each of the pixels PX comprises a switching element SW, a pixel electrode PE, the common electrode CE, the liquid crystal layer LC, and the like. The switching element SW is constituted by a thin-film transistor (TFT), for example, and is electrically connected to the scanning line G and the signal line S. More specifically, the switching element SW includes a gate electrode WG, a source electrode WS, and a drain electrode WD. The gate electrode WG is electrically connected to the scanning ling G. In the example illustrated, the electrode electrically connected to the signal line S is referred to as the source electrode WS, and the electrode electrically connected to the pixel electrode PE is referred to as the drain electrode WD.

The scanning line G is connected to the switching elements SW of the respective pixels PX arranged in the first direction X. The signal line S is connected to the switching elements SW of the respective pixels PX arranged in the second direction Y. Each pixel electrode PE is opposed to the common electrode CE, and drives the liquid crystal layer LC by an electric field produced between the pixel electrode PE and the common electrode CE. A storage capacitance CS is formed between, for example, the common electrode CE and the pixel electrode PE.

FIG. 12 is a cross-sectional view showing the structure of a part of the display panel PNL illustrated in FIG. 10. The figure illustrates a cross-section of the display device DSP taken along the first direction X. The display panel PNL illustrated in the drawing has a structure corresponding to a display mode which mainly uses a lateral electric field substantially parallel to the surface of the substrate. Note that the display panel PNL may have a structure corresponding to a display mode using a longitudinal electric field perpendicular to the surface of the substrate, an oblique electric field inclined with respect to the surface of the substrate, or a combination of those two. In the display mode using the lateral electric field, a structure including both the pixel electrodes PE and the common electrode CE on one of the first substrate SUB1 and the second substrate SUB2, for example, can be applied. In the display mode using the longitudinal electric field or the oblique electric field, a structure in which one of the pixel electrode PE and the common electrode CE is provided in the first substrate SUB1, and the other one of the pixel electrode PE and the common electrode CE is provided in the second substrate SUB2, for example, can be applied. Note that the surface of the substrate is a surface parallel to the X-Y plane.

The first substrate SUB1 includes the first basement 10, the signal line S, the common electrode CE, a metal layer M, the pixel electrode PE, a first insulating layer 11, the second insulating layer 12, a third insulating layer 13, the first alignment film AL1, and the like. Note that illustrations of the switching element, the scanning line, and various insulating layers interposed between the switching element and the scanning line are omitted.

The first insulating layer 11 is located on the first basement 10. The scanning line and a semiconductor layer of the switching element, which are not illustrated, are located between the first basement 10 and the first insulating layer 11. The signal line S is located on the first insulating layer 11. The second insulating layer 12 is located on the signal line S and the first insulating layer 11. The common electrode CE is located on the second insulating layer 12. The metal layer M is in contact with the common electrode CE directly above the signal line S. Although the metal layer M is located on the common electrode CE in the example illustrated, it may be located between the common electrode CE and the second insulating layer 12. The third insulating layer 13 is located on the common electrode CE and the metal layer M. The pixel electrode PE is located on the third insulating layer 13. The pixel electrode PE is opposed to the common electrode CE via the third insulating layer 13. Further, the pixel electrode PE has a slit SL at a position opposed to the common electrode CE. The first alignment film AL1 covers the pixel electrode PE and the third insulating layer 13.

The scanning line the signal line S, and the metal layer M are formed of a metal material such as molybdenum, tungsten, titanium, and aluminum, and may have a single-layer structure or a multilayer structure. The common electrode CE and the pixel electrode PE are formed of a transparent conductive material such as ITO or IZO. The first insulating layer 11 and the third insulating layer 13 are inorganic insulating layers, and the second insulating layer 12 is an organic insulating layer.

Note that the structure of the first substrate SUB1 is not limited to the example illustrated, and the pixel electrode PE may be located between the second insulating layer 12 and the third insulating layer 13, and the common electrode CE may be located between the third insulating layer 13 and the first alignment film AL1. In this case, the pixel electrode PE is formed in a plate shape not including a slit, and the common electrode CE includes slits opposed to the pixel electrode PE. Also, the pixel electrode PE and the common electrode CE may be both formed in a comb-like shape, and arranged so that they are engaged with each other.

The second substrate SUB2 comprises the second basement 20, the light-shielding layer BM, the color filter CF, the overcoat layer OC, the second alignment film AL2, etc.

The light-shielding layer BM and the color filter CF are located on the second basement 20 at the side opposed to the first substrate SUB1. The light-shielding layer BM delimits the pixels and is arranged directly above the signal lines S. The color filter CF is opposed to the pixel electrode PE, and a part of the color filter CF overlaps the light-shielding layer BM. The color filter CF includes a red color filter, a green color filter, a blue color filter, or the like. The overcoat layer OC covers the color filter CF. The second alignment film AL2 covers the overcoat layer OC.

Note that the color filters CF may be arranged in the first substrate SUB1. The color filters CF may include color filters of four colors or more. A white color filter or an uncolored resin material may be disposed on a pixel which displays white, or the overcoat layer OC may be disposed without arranging any of the color filters.

The detection electrode Rx is located on the surface 20B of the second basement 20. The detection electrode Rx corresponds to the second conductive layer L2, as described above. The detection electrode Rx may be formed of a conductive layer including metal or a transparent conductive material such as ITO or IZO, or by depositing a transparent conductive layer on a conductive layer including metal, or formed of a conductive organic material or a dispersing element of a fine conductive substance.

A first optical element OD1 including a first polarizer PL1 is located between the first basement 10 and an illumination device BL. A second optical element OD2 including a second polarizer PL2 is located on the detection electrode Rx. Each of the first optical element OD1 and the second optical element OD2 may include a retardation film as needed.

Next, a configuration example of the sensor SS mounted on the display device DSP of the present embodiment will be described. The sensor SS which will be described below is, for example, a mutual-capacitive sensor, which detects touch or approach of an object, based on a change in the electrostatic capacitance between a pair of electrodes opposed to each other with a dielectric interposed therebetween.

FIG. 13 is a plan view showing a configuration example of the sensor SS.

In the configuration example illustrated, the sensor SS comprises a sensor driving electrode Tx and the detection electrode Rx. In the example illustrated, the sensor driving electrode Tx corresponds to a part indicated by oblique lines sloped downward to the right, and is provided in the first substrate SUB1. Also, the detection electrode Rx corresponds to a part indicated by oblique lines sloped upward to the right, and is provided in the second substrate SUB2. That is, the sensor driving electrode Tx and the detection electrode Rx cross each other in the X-Y plane. The detection electrode Rx is opposed to the sensor driving electrode Tx in the third direction Z.

The sensor diving electrodes Tx and the detection electrodes Rx are located in the display area DA, and parts of them extend to the non-display area NDA. In the example illustrated, the sensor driving electrodes Tx are each formed in a strip shape extending in the second direction Y, and are arranged to be spaced apart from each other in the first direction X. The detection electrodes Rx extend in the first direction X, and are arranged to be spaced apart from each other in the second direction Y. As has been explained with reference to FIG. 10, each of the detection electrodes Rx is connected to the pad provided in the first substrate SUB1, and is electrically connected to the detection circuit RC via the conductive line. Each of the sensor driving electrodes Tx is electrically connected to the common electrode drive circuit CD via a conductive line WR. Note that the number, size, and shape of the sensor driving electrode Tx and the detection electrode Rx are not particularly limited, and can be changed variously.

The sensor driving electrode Tx includes the common electrode CE, has the function of producing an electric field between the sensor driving electrode Tx and the pixel electrode PE, and also has the function for detecting a position of an object by producing a capacitance between the sensor driving electrode Tx and the detection electrode Rx.

The common electrode drive circuit CD supplies a common drive signal to the sensor driving electrode Tx including the common electrode CE at a display drive time of displaying an image in the display area DA. Also, the common electrode drive circuit CD supplies a sensor drive signal to each of the sensor driving electrodes Tx at a sensing drive time of performing the sensing. Each of the detection electrodes Rx outputs a sensor signal necessary for sensing (that is, a signal based on a change in the interelectrode capacitance between the sensor driving electrode Tx and the detection electrode Rx) in accordance with supply of the sensor drive signals to the sensor driving electrodes Tx. A detection signal output from the detection electrode Rx is input to the detection circuit RC shown in FIG. 10.

Note that the sensor SS in each configuration example described above is not limited to a mutual-capacitive sensor which detects an object based on a change in the electrostatic capacitance between a pair of electrodes (in the above example, the electrostatic capacitance between the sensor driving electrode Tx and the detection electrode Rx), but may be a self-capacitive sensor which detects an object based on a change in the electrostatic capacitance of the detection electrode Rx.

Figure 14:
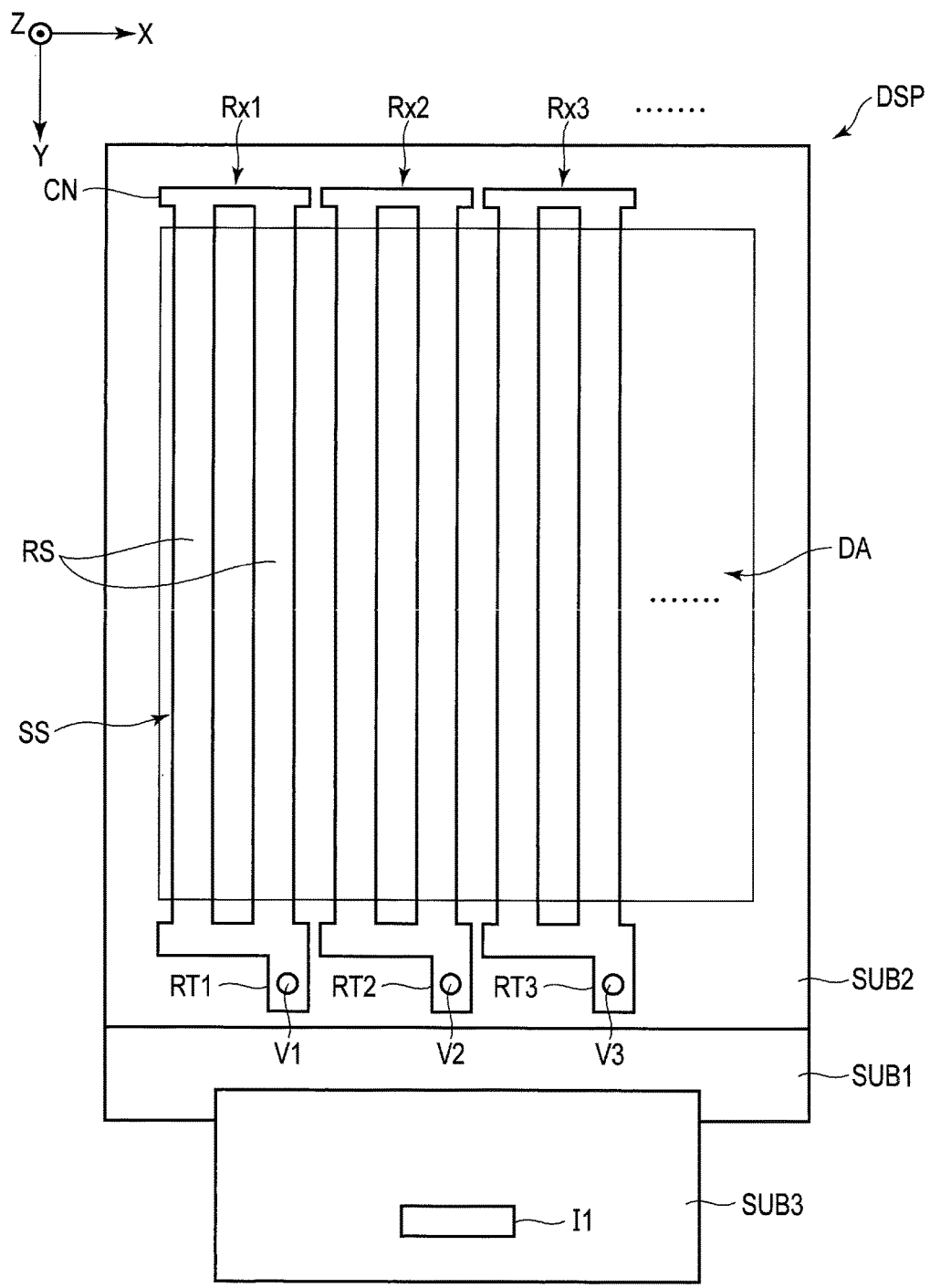
FIG. 14 is a plan view showing another configuration example of the display device DSP of the present embodiment.

FIG. 14 is a plan view showing another configuration example of the display device DSP of the present embodiment. The configuration example shown in FIG. 14 is different from the configuration example shown in FIG. 10 in that detection electrodes Rx1, Rx2, Rx3, extend in the second direction Y, and are arranged to be spaced apart from each other in the first direction X. In the example illustrated, each of the detectors RS extends in the second direction Y in the display area DA. Also, terminals RT1, RT2, RT3, . . . are arranged to be spaced apart from each other in the first direction X between the display area DA and the wiring substrate SUB3. Contact holes V1, V2, V3, . . . are arranged to be spaced apart from each other in the first direction X. Note that the display device DSP may comprise sensor driving electrodes which extend in the first direction X, and are arranged to be spaced part from each other in the second direction Y, although this is not illustrated in the figure.

The configuration example shown in FIG. 14 can be applied to a self-capacitive sensor SS which uses the detection electrodes Rx, and can also be applied to a mutual-capacitive sensor SS which uses the sensor driving electrodes, not shown, and the detection electrodes Rx.

FIG. 15 is an illustration showing a configuration example of the detector RS of the detection electrode Rx1 shown in FIGS. 10 and 14.

In the example shown in FIG. 15(A), the detector RS is formed of thin metal wires MS which constitute a mesh. The thin metal wires MS are connected to the terminal RT1. In the example shown in FIG. 15(B), the detector RS is formed of wavy thin metal wires MW. Although the thin metal wires MW have a saw-tooth configuration, they may be formed in the other shape such as a sine-wave shape. The thin metal wires MW are connected to the terminal RT1.

The terminal RT1 is formed of the same material as that of the detector RS, for example. In the terminal RT1, a circular contact hole V1 is formed.

Figure 16A:
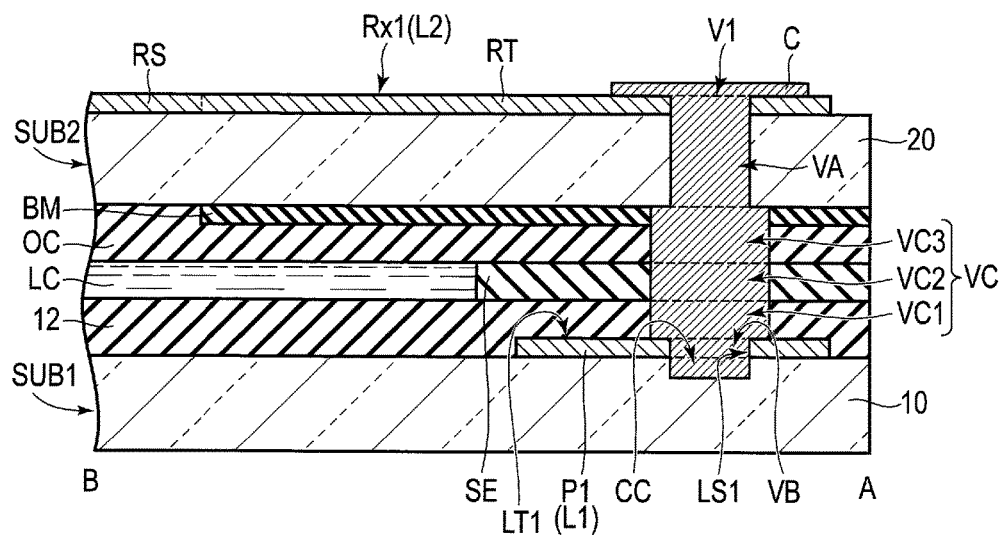
FIG. 16A is a cross-sectional view of the display panel PNL taken along line A-B including a contact hole V1 shown in FIG. 10.

FIG. 16A is a cross-sectional view of the display panel PNL taken along line A-B including the contact hole V1 shown in FIG. 10. Here, only the main portions necessary for explanation are shown.

The first substrate SUB1 comprises the first basement 10, the pad P1 corresponding to the first conductive layer L1, the second insulating layer 12 corresponding to the organic insulating layer, and the like. The first conductive layer L1 is formed of the same material as that of the signal line S shown in FIG. 12, for example. The first insulating layer 11 shown in FIG. 12, and the other insulating layers and conductive layers may be disposed between the first basement 10 and the pad P1, and between the first basement 10 and the second insulating layer 12.

The second substrate SUB2 comprises the second basement 20, the detection electrode Rx1 corresponding to the second conductive layer L2, the light-shielding layer BM and overcoat layer OC corresponding to the organic insulating layer, and the like.

The seal SE corresponds to the organic insulating layer, and is located between the second insulating layer 12 and the overcoat layer OC. The liquid crystal layer LC is located in a gap between the first substrate SUB1 and the second substrate SUB2. Although not illustrated in the figure, the metal layer M, the third insulating layer 13, and the first alignment film AL1 shown in FIG. 12 may be interposed between the second insulating layer 12 and the seal SE. Further, the second alignment film AL2 shown in FIG. 12 may be interposed between the overcoat layer OC and the seal SE.

The contact hole V1 includes the first hole VA which penetrates the second basement 20 and a terminal RT of the detection electrode Rx, the second hole VB which penetrates the pad P1, the third hole VC which penetrates various organic insulating layers, and the concavity CC formed on the first basement 10. The third hole VC includes a first portion VC1 penetrating the second insulating layer 12, a second portion VC2 penetrating the seal SE, and a third portion VC3 penetrating the light-shielding layer BM and the overcoat layer OC. The connecting material C is provided in the contact hole V1, and establishes electrical connection between the pad P1 and the detection electrode Rx.

The second insulating layer 12 is located between the pad P1 and the second basement 20, and is in contact with the upper surface LT1 of the pad P1. The connecting material C is in contact with the upper surface LT1 of the pad P1, and the inner surface LS1 of the pad P1 in the second hole VB.

Figure 16B:
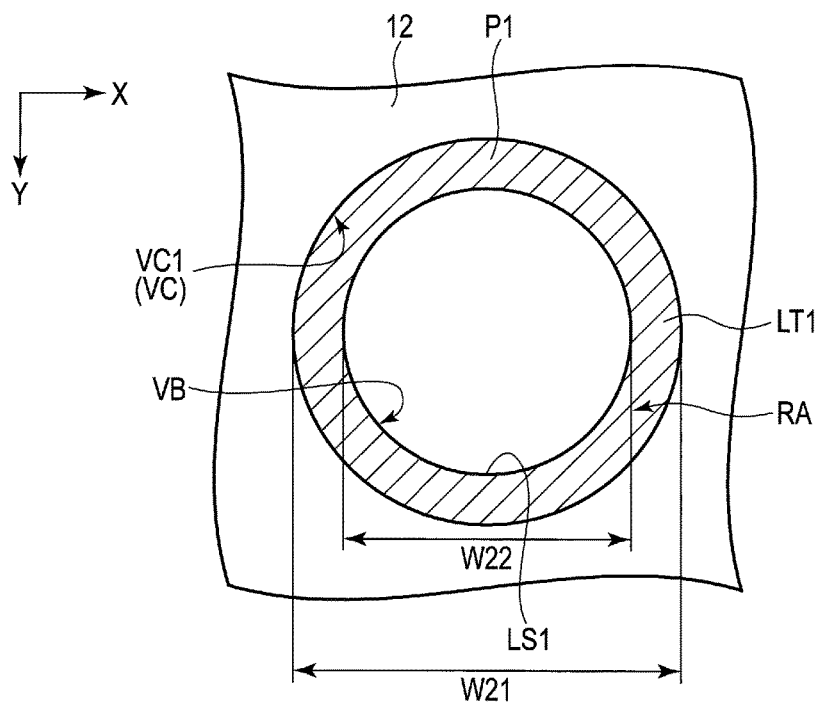
FIG. 16B is a plan view showing a pad P1 and a second insulating layer 12 shown in FIG. 16A.

FIG. 16B is a plan view showing the pad P1 and the second insulating layer 12 shown in FIG. 16A.

In planar view, the size of the first portion VC1 is greater than the size of the second hole VB. An area RA which is in contact with the connecting material C of the upper surface LT1 of the pad P1 is an area where the first portion VC1 penetrates the second insulating layer 12. In the present embodiment, the area RA is formed to be annular in planar view. The area RA is hatched. The second hole VB and the first portion VC1 are formed in a circular shape in planar view (X-Y plane). Width W21 of the first portion VC1 along the first direction X is greater than width W22 of the second hole VB along the first direction X. Also, when the shapes of the second hole VB and the first portion VC1 are circular in planar view, the width of the first portion VC1 along the second direction Y is greater than the width of the second hole VB along the second direction Y. Note that the shape of each of the second hole VB and the first portion VC1 is not limited to a perfect circle. That is, the second hole VB and the first portion VC1 may be formed in the other circular shape such as an elliptical shape, or may have a shape other than a round shape. For example, when the second hole VB and the first portion VC1 are formed to be elliptical, the widths of these elements may be those corresponding to lengths of the long axes (major axes) or those corresponding to lengths of the short axis (minor axes). Also, contours of the second hole VB and the first portion VC1 may be meandering. Note that the shape of the area RA mentioned above is not limited to an annular shape, and may be modified variously.

According to the display device DSP comprising the above-described sensor SS, the detection electrode Rx provided in the second substrate SUB2 is connected to a pad P provided in the first substrate SUB1 by the connecting material C provided in the contact hole V. Accordingly, it becomes unnecessary to mount a wiring substrate for connecting the detection electrode Rx and the detection circuit RC on the second substrate SUB2. That is, the wiring substrate SUB3 mounted on the first substrate SUB1 forms a transmission path for transmitting a signal necessary for displaying an image on the display panel PNL, and also a transmission path for transmitting a signal between the detection electrode Rx and the detection circuit RC. Therefore, as compared to a configuration structure which requires a different wiring substrate separately from the wiring substrate SUB3, the number of wiring substrates can be reduced, and the cost can be reduced. In addition, since space for connecting the wiring substrate to the second substrate SUB2 is not required, it becomes possible to reduce the size of the non-display area of the display panel PNL, in particular, the width of an edge side on which the wiring substrate SUB3 is mounted. Consequently, achieving a narrower frame structure and cost reduction is enabled.

Manufacturing Method of Display Device

Next, an example of a method of manufacturing the above-described display device DSP will be described with reference to FIGS. 17 to 19.

First, as shown in FIG. 17(A), the display panel PNL is prepared. The illustrated display panel PNL comprises the first substrate SUB1 including at least the first basement 10 and the first conductive layer L1, and the second substrate SUB2 including at least the second basement 20 and the second conductive layer L2. In the display panel PNL, the first substrate SUB1 and the second substrate SUB2 are adhered to each other by the seal SE in a state in which the second basement 20 is opposed to the first conductive layer L1, and the second basement 20 is separated from the first conductive layer L1. Note that the first conductive layer L1 corresponds to, for example, the pad P1 illustrated in FIG. 16A, and the second conductive layer L2 corresponds to, for example, the detection electrode Rx1 illustrated in FIG. 16A.

One example of a method of manufacturing the display panel PNL as described above will be explained. More specifically, the first substrate SUB1 in which the first conductive layer L1, the second insulating layer 12, etc., are formed on the surface 10A of the first basement 10 is prepared. Meanwhile, the second substrate SUB2 in which the light-shielding layer BM, the overcoat layer OC, etc., are formed on the surface 20A of the second basement 20 is prepared. At this point, the second conductive layer is not formed on the surface 20B of the second substrate SUB2. On either of the first substrate SUB1 and the second substrate SUB2, the seal SE shaped like a loop is formed, and a liquid crystal material is dropped on the inner side with respect to the seal SE. After that, the first substrate SUB1 and the second substrate SUB2 are bonded, and the seal SE is cured to accomplish adhesion of the first substrate SUB1 and the second substrate SUB2. Then, each of the first basement 10 and the second basement 20 is etched by an etching liquid such as hydrofluoric acid (HF), and the first basement 10 and the second basement 20 are thinned. After that, the second conductive layer L2 is formed on the surface 20B of the second basement 20. In this way, the display panel PNL shown in FIG. 17(A) is manufactured.

Further, another example of a method of manufacturing the display panel PNL will be described. More specifically, in addition to preparing the first substrate SUB1 in the same way as in the above example, the second substrate SUB2 in which the light-shielding layer BM, the overcoat layer OC, etc., are formed on the surface 20A of the second basement 20, and the second conductive layer L2 is formed on the surface 20B of the second basement 20 is prepared. Then, after forming the seal SE and dropping the liquid crystal material, the first substrate SUB1 and the second substrate SUB2 are adhered to each other. In this way, the display panel PNL shown in FIG. 17(A) is manufactured.

Next, as shown in FIG. 17(B), a laser beam L is irradiated onto the second substrate SUB2. In the example illustrated, the laser beam L is irradiated from the upper side of the second conductive layer L2. While a carbon dioxide laser device, for example, can be applied as a laser light source, it is sufficient if the glass material and organic material can be perforated, and a device such as an excimer laser device is also applicable.

As such a laser beam L is irradiated, as shown in FIG. 17(C), the first hole (VA) which penetrates the second basement 20 and the second conductive layer L2 is formed. Also, in the example illustrated, when the laser beam L is irradiated, the third portion VC3 penetrating the light-shielding layer BM and the overcoat layer OC located directly under the first hole VA, the second portion VC2 penetrating the seal SE which is located directly under the third portion VC3, the first portion VC1 penetrating the second insulating layer 12 which is located directly under the second portion VC2, the second hole VB penetrating the first conductive layer L1 which is located directly under the first portion VC1, and the concavity CC of the first basement 10 which is located directly under the second hole VB are also simultaneously formed. The contact hole V1 for connecting the first conductive layer L1 and the second conductive layer L2 is thereby formed.

When thermal energy is given to the display panel PNL by irradiation of the laser beam L, sublimation occurs more easily with the organic insulating material which forms the second insulating layer 12 than the metal material which forms the pad P1. Accordingly, as described above, the third hole VC is formed to be more enlarged than the first hole VA and the second hole VB.

Next, as shown in FIG. 18, the connecting material C which electrically connects the first conductive layer L1 and the second conductive layer L2 is formed.

More specifically, first, as shown in FIG. 18(A), after placing the display panel PNL within a chamber CB, air in the chamber CB is discharged, and the connecting material C is injected into the first hole VA in a vacuum (environment in which the pressure is lower than the atmospheric pressure). At this time, there may be a case where the connecting material C does not flow to the first conductive layer L1, and a space SP is created between the connecting material C and the first conductive layer L1. However, the space SP is a vacuum.

After that, as shown in FIG. 18(B), by introducing air and gas such as inactive gas into the chamber CB, the degree of vacuum is lowered, so that the connecting material C flows into the third hole VC, the second hole VB, and the concavity CC from the first hole VA by a pressure difference between the space SP and the periphery of the display panel PNL, and the connecting material C is made to contact the first conductive layer L1. The connecting material C contacts the inner surface LS1 and the upper surface LT1 of the first conductive layer L1.

After that, as shown in FIG. 18(C), the volume of the connecting material C is reduced and a hollow portion HL is formed by removal of a solvent included in the connecting material C. The connecting material C formed in this way contacts each of the second conductive layer L2 and the second basement 20 in the first hole VA, contacts each of the light-shielding layer BM, the overcoat layer OC, the seal SE, and the second insulating layer 12 in the third hole VC, contacts the first conductive layer L1 in the second hole VB, and contacts the first basement 10 in the concavity CC.

Note that a method of forming the connecting material C explained referring to FIG. 18 is merely an example, and the method is not limited to this. For example, even if a method of removing a solvent included in the connecting material C after injecting the connecting material C into the first hole VA under the atmospheric pressure is adopted, the connecting material C similar to the above can be formed.

Next, as shown in FIG. 19(A), the protection material PF is formed. In the example illustrated, the protection material PF is filled in the hollow portion HL of the connecting material C, and also covers the second conductive layer L2 and the connecting material C. Thereby, a surface SUB2A of the second substrate SUB2 is substantially planarized, and a difference in level (i.e., a fall) at a place overlapping the contact hole V1 can be moderated.

Next, as shown in FIG. 19(B), the second optical element OD2 is adhered to the protection material PF. In the example illustrated, the second optical element OD2 extends over a portion which overlaps the contact hole V1. Since a difference in level due to the contact hole V1 is moderated by the protection material PF, when the second optical element OD2 adhered, peeling of the second optical element OD2 caused by an underlayer not being flush with the second optical element OD2 can be suppressed.

First Modified Example

FIG. 21 is a plan view showing a first modified example of the present embodiment. The first modified example corresponds to a modification of the display device DSP. The first modified example shown in FIG. 21 is different from the configuration example shown in FIG. 10 in that each of the detection electrodes Rx provided in the second substrate SUB2 comprises a plurality of terminals RT. While FIG. 21 illustrates detection electrodes Rx1 to Rx4, the detection electrode Rx1 is focused here for explaining an example of the structure of the detection electrode.

More specifically, the detection electrode Rx1 comprises detectors RS11 and RS12, terminals RT11 and RT12, and connections CN11 and CN12.

Each of the detectors RS11 and RS12 is located in the display area DA, and extends in the first direction X. In the example illustrated, although a single detection electrode Rx1 comprises two detectors RS11 and RS12, the detection electrode may comprise three or more detectors RS, or only one detector RS.

The connections CN11 and CN12 are both located in the non-display area NDA, and are arranged opposite to each other with the display area DA interposed therebetween. The connections CN11 and CN12 extend in the second direction Y, and connect the detectors RS11 and RS12 arranged in the second direction Y to each other.

The terminals RT11 and RT12 are located in the non-display area NDA, and are connected to the connection CN11.

Meanwhile, the first substrate SUB1 comprises pads P11 and P12 corresponding to a single detection electrode Rx1. The pads P11 and P12 are connected to the conductive line W1. The pads P11 and P12 are formed at positions where these pads overlap the terminals RT11 and RT12, respectively, in planar view.

The contact hole V11 is formed at a position where the terminal RT11 and the pad P11 are opposed to each other. As has been explained with reference to FIG. 1, etc., the connecting material C is provided in the contact hole V11. Consequently, the terminal RT11 and the pad P11 are electrically connected. Similarly, the contact hole V12 is formed at a position where the terminal RT12 and the pad P12 are opposed to each other, and the terminal RT12 and the pad P12 are electrically connected by the connecting material not shown.

According to the first modified example as described above, a single detection electrode Rx includes a plurality of terminals RT, the pads P opposed to the respective terminals RT are provided, and the terminals RT and the pads P are electrically connected to each other by the connecting material C. Because of this feature, even if connection between one of the terminals RT and the corresponding pad P becomes defective, electrical connection can be established by way of the remaining terminals RT and pad P, thereby improving the reliability.

Second Modified Example

FIG. 22 is a plan view showing a second modified example of the present embodiment. The second modified example corresponds to a modification of the terminal RT in the detection electrode Rx. Here, although an explanation will be given focusing on the detection electrode Rx3 including a terminal RT32 surrounded by a dotted line in FIG. 21, the second modified example shown in FIG. 22 can be applied to the terminal of the other configuration described above as a matter of course. FIG. 23 is a cross-sectional view of the display device DSP taken along line C-D including the terminal RT32 shown in FIG. 22.

Almost the entirety of the detection electrode Rx3 is constituted of a stacked layer body comprising a first layer L31 and a second layer L32. In other words, in the detection electrode Rx3, the detector, the connection, and the terminal are all constituted of the stacked layer body. Note that the detection electrode Rx3 is not limited to a two-layer structure, but may be a stacked layer body of three layers of more.

The first layer L31 is a conductive layer having low resistance, and constitutes the main part of the detection electrode Rx3. In one example, the first layer L31 is a metal layer formed of a metal material such as aluminum (Al), titanium (Ti), silver (Ag), molybdenum (Mo), tungsten (W), copper (Cu) and chromium (Cr), or an alloy obtained by combining these metal materials.

The second layer L32 is a reflection suppressing layer which suppresses reflection at the first layer L31, has a lower reflectance than the first layer L31, and is a blackened layer whose surface is visually recognized as black substantially. The second layer L32 has electrical resistance higher than that of the first layer L31, in one example. The second layer L32 may be formed of a conductive material or an insulating material. The second layer L32 itself may be a multi-layered body or a single-layer body. Also, the second layer L32 may be formed of an organic material such as black resin, an inorganic material such as a metal oxide, or both of the organic material and inorganic material.

For example, the second layer L32 is constituted of a dielectric multi-layered body formed of a plurality of dielectric layers having different refractive indexes stacked on one another. In one example, a dielectric layer having a high refractive index is formed of $TiO_2$, $Nb_2O_5$, or $Ta_2O_5$, and a dielectric layer having a low refractive index is formed of $SiO_2$ or $MgF_2$.

In another example, the second layer L32 is constituted of a light-absorbing material such as black resin.

As shown in FIG. 22, the terminal RT32 includes an aperture AP in which the second layer L32 is removed. The aperture AP is penetrated to the first layer L31. In FIG. 22, a region indicated by oblique lines sloped upward to the right corresponds to a region in which the first layer L31 and the second layer L32 are stacked, and a region indicated by oblique lines sloped downward to the right corresponds to a region in which the second layer L32 is removed and the first layer L31 exists. Such an aperture AP is formed along a contour of the terminal RT32, and has a shape formed by connecting small circular openings APA in a circle in the example illustrated. Note that the shape of the aperture AP is not limited to the example illustrated, and small openings APA may be discontinuously formed. The opening APA can be formed by irradiating a laser beam, for example.

At a central part of the terminal RT32, a contact hole V32 is formed. The connecting material C is in contact with the terminal RT32, and also a pad P32 via the contact hole V32. The connecting material C is in contact with the first layer L31, which is a conductive layer, in the aperture AP of the terminal RT32. In a hollow portion of the connecting material C, a filling material FI is filled. The filling material FI covers not only the connecting material C, but also the second layer L32 of the detection electrode Rx3, the first layer L31 in the aperture AP, etc. Note that the entire detection electrode Rx3 may be covered with a protection material.

According to such a second modified example, when a pasty connecting material C is injected into the contact hole V32, if the wettability of the connecting material C to the second layer L32 is lower than the wettability of the connecting material C to the first layer L31, the connecting material C spreads over the surface of the first layer L31 in the aperture AP, and conductivity between the detection electrode Rx3 and the connecting material C can be improved. Also, in a case where the second layer L32 has conductivity similarly to the first layer L31, since the connecting material C contacts both of the first layer L31 in the aperture AP and the second layer L32 not in the aperture, an area of contact of the connecting material C with the detection electrode Rx3 can be increased.

Third Modified Example

Figure 24:
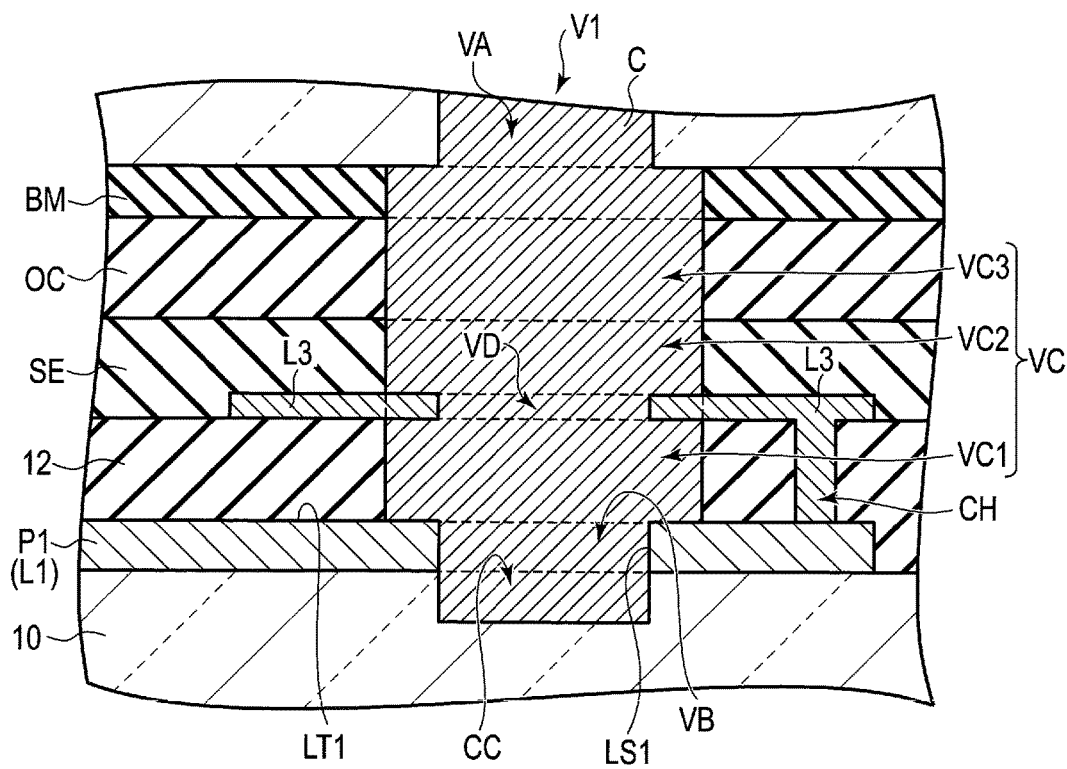
FIG. 24 is a cross-sectional view showing a third modified example of the present embodiment.

FIG. 24 is a cross-sectional view showing a third modified example of the present embodiment. The third modified example corresponds to a modification of the display device DSP. A third modified example shown in FIG. 24 is different from the configuration example shown in FIG. 16A in that the connecting material C contacts not only the pad P1 (the first conductive layer L1), but also a third conductive layer L3.

The first substrate SUB1 further includes the third conductive layer L3. The third conductive layer L3 is located between the second insulating layer 12 and the seal SE. The third conductive layer L3 is formed of a metal material such as molybdenum, tungsten, titanium, aluminum, silver, copper, or chromium, or an alloy formed of a combination of these metal materials. The third conductive layer L3 may have a single-layer structure or a multilayer structure. For example, the third conductive layer L3 can be formed simultaneously with the metal layer M shown in FIG. 12 by using the same material. The third conductive layer L3 is electrically connected to the pad P1. In this modified example, the third conductive layer L3 passes a contact hole CH formed in the second insulating layer 12, and is in contact with the pad P1. The contact hole V1 includes a fourth hole VD which penetrates the third conductive layer L3. The fourth hole VD is connected to the first portion VC1 and the second portion VC2.

Figure 25:
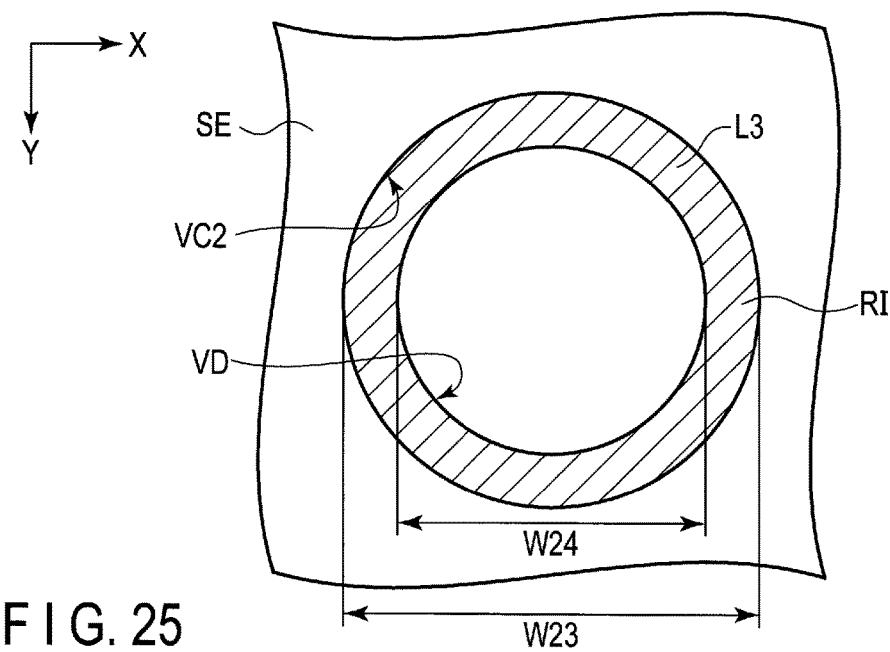
FIG. 25 is a cross-sectional view showing a seal SE and a third conductive layer L3 shown in FIG. 24.

FIG. 25 is a cross-sectional view showing the seal SE and the third conductive layer L3 shown in FIG. 24. The fourth hole VD is formed to be circular in planar view. The second portion VC2 is extended in all directions in the X-Y plane as compared to the fourth hole VD. In planar view, the size of the second portion VC2 is greater than the size of the fourth hole VD. Width W23 of the second portion VC2 along the first direction X is greater than width W24 of the fourth hole VD along the first direction X.

Also in this modified example, when thermal energy is given to the display panel PNL by irradiation of a laser beam, sublimation occurs more easily with the organic insulating material which forms the second insulating layer 12 and the organic insulating material which forms the seal SE than the metal material which forms the third conductive layer L3. Accordingly, as described above, the sizes of the first portion VC1 and the second portion VC2 become greater than the size of the fourth hole VD.

The third conductive layer L3 includes an annular portion RI which is not covered with the second insulating layer 12 and the seal SE. The connecting material C is in contact with the annular portion RI of the third conductive layer L3. In FIG. 25, the annular portion RI is hatched.

Note that ashing may be carried out after irradiating a laser beam onto the display panel PNL for forming the contact hole V1. Since a residue of the organic insulating material which may exist inside the contact hole V1 can be removed by the above processing, the above-described annular portion RI can further be exposed.

According to the third modified example, the connecting material C is in contact with not only the pad P1, but also the third conductive layer L3. Consequently, a contact area can be increased as a result of increase in the contact area of the connecting material C with the third conductive layer L3.

Second Embodiment: First Configuration Example

Next, a second embodiment will be described. In the second embodiment, an explanation will be given by focusing mainly on the first hole VA of the contact hole V.

Figure 26:
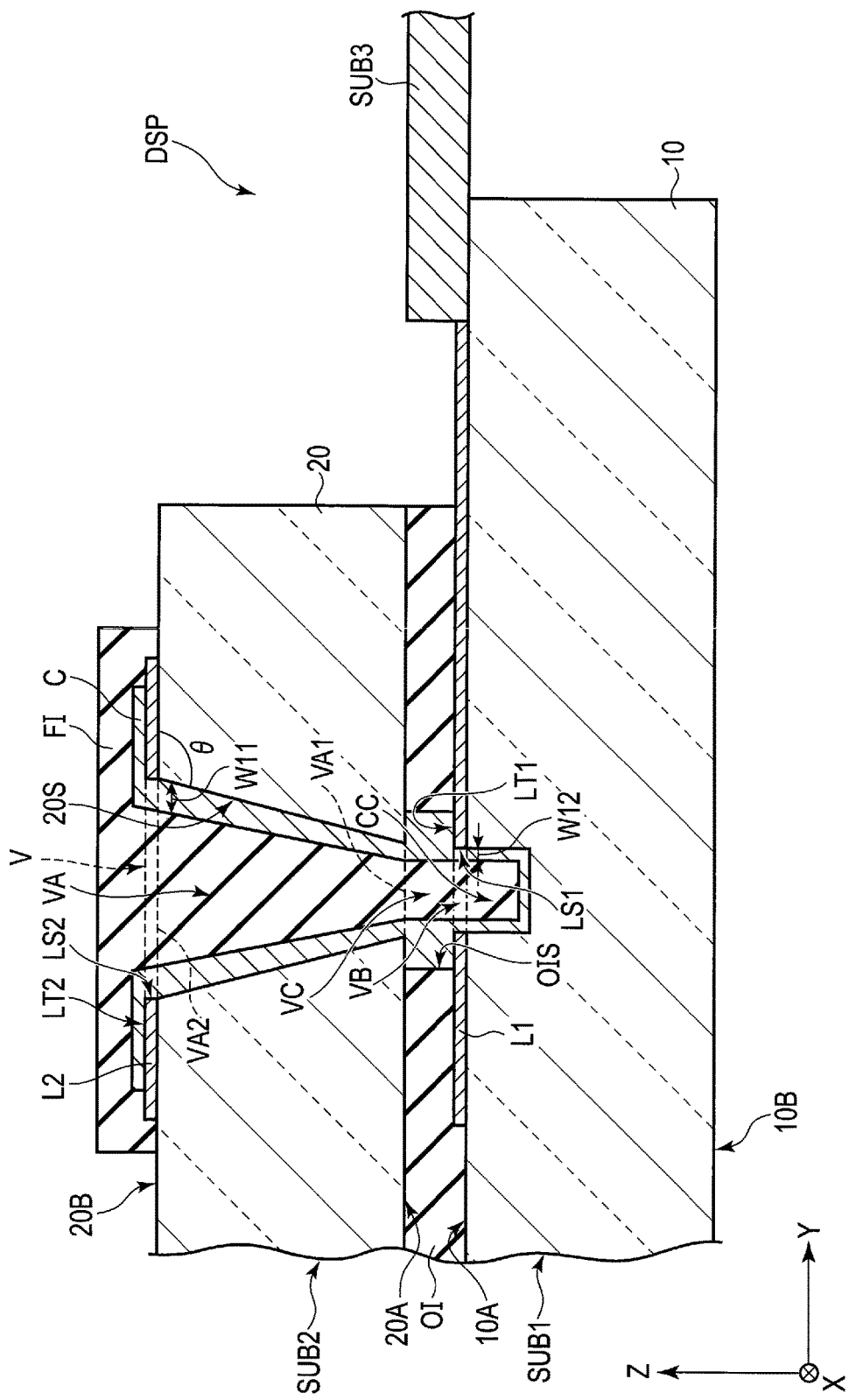
FIG. 26 is a cross-sectional view showing a configuration example of the display device DSP of the present embodiment.

FIG. 26 is a cross-sectional view showing a first configuration example of a display device DSP of the present embodiment.

A second basement 20 includes a surface 20A opposed to a first substrate SUB1, and a surface 20B on a side opposite to the surface 20A. The surface 20A corresponds to a first surface, and the surface 20B corresponds to a second surface. The surface 20A is opposed to a first conductive layer L1, and is separated from the first conductive layer L1 in the third direction Z. In the example illustrated, a second conductive layer L2 is located on the surface 20B. A first basement 10, the first conductive layer L1, the second basement 20, and the second conductive layer L2 are arranged in the third direction Z in this order. Although an organic insulating layer OI is located between the first conductive layer L1 and the second basement 20, an inorganic insulating layer or the other conductive layer may be located therebetween, or an air layer may be located therebetween.

A connecting material C is in contact with each of an upper surface LT2 and an inner surface LS2 of the second conductive layer L2, and an inner surface 20S of the second basement 20, in a second substrate SUB2. Further, the connecting material C is in contact with an inner surface OIS of the organic insulating layer OI. Furthermore, the connecting material C is in contact with each of an upper surface LT1 and an inner surface LS1 of the first conductive layer L1, and a concavity CC, in the first substrate SUB1. In the example illustrated, although the connecting material C is provided on each of an inner surface of a first hole VA (that is, the inner surface LS2 and the inner surface 20S), an inner surface of a third hole VC (that is, the inner surface OIS), an inner surface of a second hole VB (that is, the inner surface LS1), and the concavity CC, the connecting material C is not filled around a central part of each of these holes. Accordingly, the connecting material C includes a hollow portion. The connecting material C of the above shape is formed by being injected from the first hole VA under the atmospheric pressure or in an environment in which the pressure is lower than the atmospheric pressure, and removing a solvent included in the connecting material C.

In the hollow portion of the connecting material C, a filling material FI having insulating properties is filled. In the example illustrated, the filling material FI covers the connecting material C overlapping the second conductive layer L2 on the surface 20B, and also the second conductive layer L2 which is not covered with the connecting material C, and moreover, the filling material FI is in contact with the surface 20B of the second basement 20. The filling material FI is formed of an organic insulating material such as acrylic resin. Note that the connecting material C may be filled to fill the first hole VA, the third hole VC, the second hole VB, and the concavity CC. Such a connecting material C is continuously formed between the first conductive layer L1 and the second conductive layer L2 without a break. Thereby, the second conductive layer L2 is electrically connected to a wiring substrate SUB3 via the connecting material C and the first conductive layer L1.

Also in the second embodiment, advantages similar to those of the first embodiment can be obtained. Also, since the connecting material C contacts not only the inner surface LS2 but also the upper surface LT2 of the second conductive layer L2, it is possible to increase a contact area of the connecting material C with the second conductive layer L2, and suppress poor connection between the connecting material C and the second conductive layer L2. In addition, since the connecting material C contacts not only the inner surface LS1 but also the upper surface LT1 of the first conductive layer L1, it is possible to increase a contact area of the connecting material C with the first conductive layer L1, and suppress poor connection between the connecting material C and the first conductive layer L1. Further, because the filling material FI is filled in the hollow portion of the connecting material C, a difference in level in the third direction Z brought about by the hollow portion formed in the connecting material C can be moderated. Furthermore, since the filling material FI covers the connecting material C and the second conductive layer L2, the second conductive layer L2 and the connecting material C can be protected.

In addition, according to the present embodiment, the first hole VA includes a first portion VA1 along the surface 20A, and a second portion VA2 along the surface 20B, and the first portion VA1 is smaller than the second portion VA2. In other words, the first portion VA1 of the first hole VA is provided within the surface 20A, and the second portion VA2 is provided within the surface 20B. From another point of view, it can be assumed that the first portion VA1 is the interface of the first hole VA at the first surface 20A, and the second portion VA2 is the interface of the first hole VA at the second surface 20B. In a cross-sectional view, the first hole VA is formed in a forwardly tapered shape that the width along the second direction Y is increased toward the upper side along the third direction Z (in other words, from the surface 20A toward the surface 20B). Also, in a cross-sectional view, the inner surface 20S is formed linearly. Angle θ between the inner surface 20S and the surface 20B is an obtuse angle greater than 90 degrees. Note that the inner surface 20S is not limited to the example illustrated, and has a shape including at least one of a straight line and a curved line in a cross-sectional view.

With the first hole VA having such a shape, in a process of forming the connecting material C which will be described later, more connecting material C can be arranged on the inner surface 20S. In one example, width W11 along the second direction Y of the connecting material C arranged on the inner surface 20S near the second portion VA2 is greater than width W12 along the second direction Y of the connecting material C arranged in the concavity CC. Also, since angle θ is an obtuse angle, it is possible suppress a discontinuity between the connecting material C in contact with the second conductive layer L2 and the connecting material C in contact with the inner surface 20S.

Further, though not described in detail, the width along the second direction Y of each of the second hole VB and the concavity CC is equal to or less than the width along the second direction Y of the first portion VA1, and less than the width along the second direction Y of the second portion VA2.

FIG. 27 is a perspective view showing the first configuration example of the first hole VA formed in the second basement 20.

In the example illustrated, the first portion VA1 and the second portion VA2 are both formed to be circular. The first hole VA is formed in the shape of a truncated cone. The first portion VA1 corresponds to a region indicated by oblique lines sloped upward to the right in FIG. 27, and the second portion VA2 corresponds to a region indicated by oblique lines sloped downward to the right in FIG. 27. The area of the first portion VA1 is less than the area of the second portion VA2. Also, diameter D1 of the first portion VA1 is less than diameter D2 of the second portion VA2. Here, diameters D1 and D2 correspond to lengths along the first direction X. In one example, diameter D2 is twice to fourfold diameter D1. Further, center O1 of the first portion VA1 and center O2 of the second portion VA2 are located on the same straight line LA that is parallel to a normal (third direction Z) of the second basement 20.

Second Configuration Example

FIG. 28A is a cross-sectional view showing a second configuration example of the first hole VA. The second configuration example shown in FIG. 28A is different from the first configuration example shown in FIG. 26 in that the inner surface 20S is formed in a shape including a curved line 20C in a cross-sectional view. Note that the inner surface 20S may be formed in a shape including a combination of a plurality of curved lines 20C.

Third Configuration Example

FIG. 28B is a cross-sectional view showing a third configuration example of the first hole VA. The third configuration example shown in FIG. 28B is different from the first configuration example shown in FIG. 26 in that the inner surface 20S is formed in a shape including a straight line 20L and the curved line 20C in a cross-sectional view. In the example illustrated, the straight line 20L is located on a side closer to the first portion VA1, and the curved line 20C is located on a side closer to the second portion VA2. Note that the straight line 20L may be located on the side closer to the second portion VA2, and the curved line 20C may be located on the side closer to the first portion VA1. Also, with reference to an intermediate position 20M, which is at a point half the thickness of the second basement 20 along the third direction Z, the curved line 20C is located on the side closer to the second portion VA2 than the intermediate position 20M, but it may be extended toward the first portion VA1 beyond the intermediate position 20M.

Fourth Configuration Example

FIG. 28C is a cross-sectional view showing a fourth configuration example of the first hole VA. The fourth configuration example shown in FIG. 28C is different from the first configuration example shown in FIG. 26 in that the inner surface 20S is formed in a shape including the straight line 20L, and curved lines 20C1 and 20C2 in a cross-sectional view. In the example illustrated, the curved line 20C1 is located on the side closer to the first portion VA1, the curved line 20C2 is located on the side closer to the second portion VA2, and the straight line 20L is located between the curved line 20C1 and the curved line 20C2. Note that the inner surface 20S may be formed in a shape including a combination of a plurality of straight lines 20L and a plurality of curved lines 20C.

Fifth Configuration Example

FIG. 29A is a cross-sectional view showing a fifth configuration example of the first hole VA. In the fifth configuration example illustrated in FIG. 29A, the first hole VA includes a third portion VA3 between the first portion VA1 and the second portion VA2. The third portion VA3 is parallel to the X-Y plane, and is located on the side closer to the first portion VA1 than the intermediate position 20M.

The first hole VA is formed in a forwardly tapered shape that the width along the second direction Y is increased toward the upper side along the third direction Z between the first portion VA1 and the third portion VA3, and between the third portion VA3 and the second portion VA2. In the example illustrated, of the inner surface 20S, an inner surface S23 between the third portion VA3 and the second portion VA2 slopes more gently than an inner surface S13 between the first portion VA1 and the third portion VA3. That is, angle θ3 between the third portion VA3 and the inner surface S23 is greater than angle θ1 between the first portion VA1 and the inner surface S13. Note that both of θ1 and θ3 are an obtuse angle. Also, in FIGS. 29A to 29C, the inner surfaces S13 and S23 may both be defined by a straight line in a cross-sectional view, or by a curved line or a shape formed by combining the straight line and the curved line.

Sixth Configuration Example

FIG. 29B is a cross-sectional view showing a sixth configuration example of the first hole VA. The sixth configuration example shown in FIG. 29B is different from the fifth configuration example shown in FIG. 29A in that the first hole VA has a substantially uniform width along the second direction Y between the first portion VA1 and the third portion VA3. In the example illustrated, the formed angle θ1 is substantially 90 degrees.

Seventh Configuration Example

FIG. 29C is a cross-sectional view showing a seventh configuration example of the first hole VA. The seventh configuration example shown in FIG. 29C is different from the fifth configuration example shown in FIG. 29A in that the first hole VA is formed in a reversely tapered shape that the width along the second direction Y is reduced toward the upper side along the third direction Z between the first portion VA1 and the third portion VA3. In the example illustrated, the formed angle θ1 is an acute angle.

Modified Example of Pad

FIG. 30 is a plan view showing the pad P1 illustrated in FIG. 10 in enlarged scale. The figure illustrates the pad P1 located on a panel end portion PNLE along the second direction Y, and illustration of a conductive line connected to the pad P1, a conductive line around the pad P1, etc., is omitted. In the example illustrated, the pad P1 is formed in an octagonal shape. Also, the pad P1 overlaps the seal SE, and is formed of the same material as that of the signal line S shown in FIG. 12, for example. In the pad P1, a slit ST which penetrates the pad P1 is formed. In the example illustrated, slits ST extend in the second direction Y, and are arranged in the first direction X. Accordingly, when the seal SE is formed by using a photosensitive resin material, since an area in which the photosensitive resin material overlaps the pad P1 is exposed through the slits ST, it is possible to prevent the seal SE from being uncured. Note that the number of slits ST formed in the pad P1 and the shape of each slit ST are not limited to the example illustrated.

Here, the positional relationship of the pad P1 with the first hole VA, the second hole VB, and the third hole VC is focused. In planar view, the second hole VB which penetrates the pad P1 is formed at a position substantially the same as the position of the first portion VA1 of the first hole VA, and is formed in substantially the same size as the first portion VA1. Each of the first portion VA1 and the second hole VB is formed in the shape of a circle whose diameter is smaller than the width of the pad P1 in the first direction X and the second direction Y, and is located at substantially the center of the pad P1. The slits ST are located at the periphery of the second hole VB. The second portion VA2 of the first hole VA is larger than the first portion VA1, and in the example illustrated, is larger than the pad P1. As described above, since the first hole VA is formed in a forwardly tapered shape, it is sufficient if at least the first portion VA1 of the first hole VA or the second hole VB is formed smaller than the pad P1, and the second portion VA2 may be formed larger than the pad P1.

The seal SE is included in the organic insulating layer OI shown in FIG. 26. The third hole VC which has been illustrated penetrates the organic insulating layer OI including the seal SE to the pad P1. A region BC between the second hole VB and the third hole VC, as shown by oblique lines sloped upward to the right in FIG. 30, corresponds to a region not overlapping the organic insulating layer OI of the pad P1 (including the slits ST). The region BC is formed to be annular. The connecting material C shown in FIG. 26 is in contact with the pad P1 located at the region BC.

In the example illustrated, each of the first portion VA1 and the second hole VB is formed to reach where each of two adjacent slits ST is provided, as shown by a solid line in FIG. 30. Alternatively, the first portion VA1 and the second hole VB may be formed such that they are formed between the two slits ST and do not overlap either of the slits ST, as shown by a dotted line in FIG. 30.

Display Panel: First Configuration Example

Figure 31:
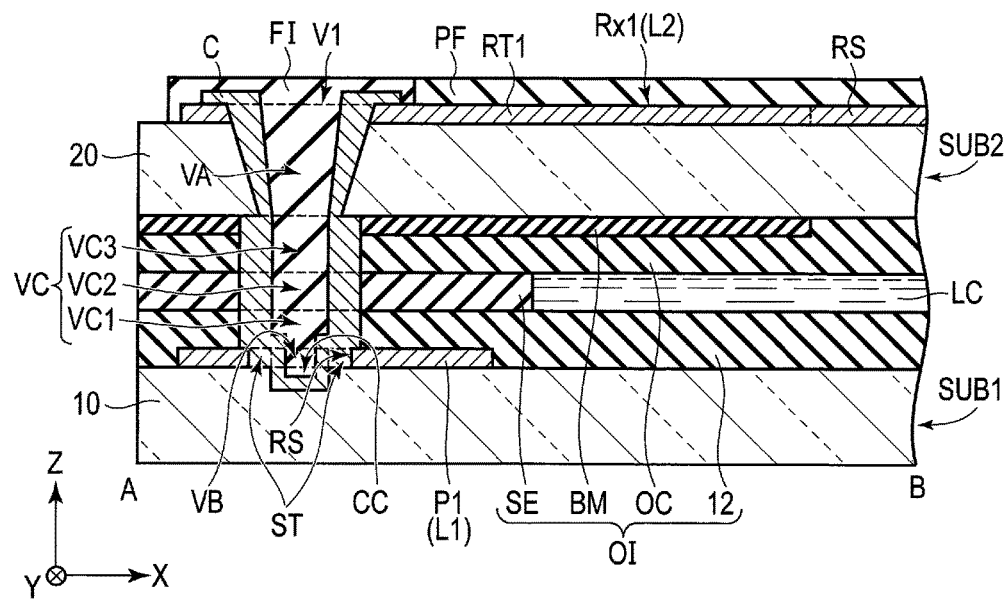
FIG. 31 is a cross-sectional view showing a configuration example of the display panel PNL taken along line A-B including the contact hole V1 shown in FIG. 10.

FIG. 31 is a cross-sectional view showing a first configuration example of the display panel PNL taken along line A-B including the contact hole V1 shown in FIG. 10. Here, only the main portions necessary for explanation are shown.

The first substrate SUB1 comprises the first basement 10, the pad P1 corresponding to the first conductive layer L1, the second insulating layer 12 corresponding to the organic insulating layer OI, etc. The first insulating layer 11 shown in FIG. 12, and the other insulating layers and conductive layers may be disposed between the first basement 10 and the pad P1, and between the first basement 10 and the second insulating layer 12.

The second substrate SUB2 comprises the second basement 20, the detection electrode Rx1 corresponding to the second conductive layer L2, the light-shielding layer BM and overcoat layer OC corresponding to the organic insulating layer OI, etc. Part of at least the detector RS and the terminal RT1 of the detection electrode Rx1 is covered with the protection material PF. The protection material PF is formed of an organic insulating material such as acrylic resin.

The seal SE corresponds to the organic insulating layer OI, and is located between the second insulating layer 12 and the overcoat layer OC. The liquid crystal layer LC is located between the first substrate SUB1 and the second substrate SUB2. Although not illustrated in the figure, the metal layer M, the third insulating layer 13, and the first alignment film AL1 shown in FIG. 12 may be interposed between the second insulating layer 12 and the seal SE. Further, the second alignment film AL2 shown in FIG. 12 may be interposed between the overcoat layer OC and the seal SE.

The contact hole V1 includes the first hole VA which penetrates the second basement 20 and the terminal RT of the detection electrode Rx, the second hole VB which penetrates the pad P1, the third hole VC which penetrates various organic insulating layers OI, and the concavity CC formed on the first basement 10. The third hole VC includes the first portion VC1 which penetrates the second insulating layer 12, the second portion VC2 which penetrates the seal SE, and the third portion VC3 which penetrates the light-shielding layer BM and the overcoat layer OC. When the first alignment film AL1 is interposed between the seal SE and the second insulating layer 12, the first portion VC1 also penetrates the first alignment film AL1. When the second alignment film AL2 is interposed between the seal SE and the overcoat layer OC, the third portion VC3 also penetrates the second alignment film AL2 (FIG. 12). The first portion VC1, the second portion VC2, and the third portion VC3 are arranged in the third direction Z in this order. The second portion VC2 is connected to the first portion VC1 and the third portion VC3.

The connecting material C is provided in the contact hole V1, and establishes electrical connection between the pad P1 and the detection electrode Rx. In the hollow portion of the connecting material C, the filling material FI having insulating properties is filled. Members which contact the connecting material C in the contact hole V1 will be described more specifically. That is, the connecting material C is in contact with each of the terminal RT1 and the second basement 20 in the first hole VA. Further, the connecting material C is in contact with each of the light-shielding layer BM and the overcoat layer OC in the third portion VC3, the seal SE in the second portion VC2, and the second insulating layer 12 in the first portion VC1. Furthermore, the connecting material C is in contact with the pad P1 in the second hole VB, and the first basement 10 in the concavity CC. In the example illustrated, since the pad P1 is provided with the slit ST, the connecting material C is in contact with a side surface PS of the pad P1 in the slit ST. Accordingly, as compared to a case where the pad P1 is not provided with slits ST, an area of contact between the pad P1 and the connecting material C can be increased.

Display Panel: Second Configuration Example

Figure 32:
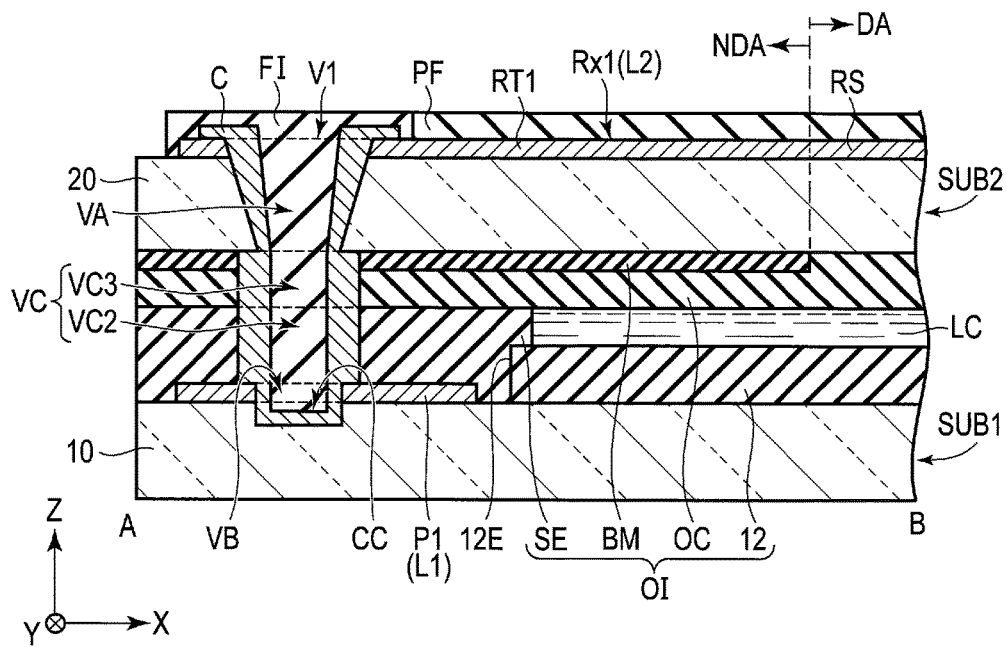
FIG. 32 is a cross-sectional view showing another configuration example of the display panel PNL.

FIG. 32 is a cross-sectional view showing a second configuration example of the display panel PNL taken along line A-B including the contact hole V1 shown in FIG. 10. Note that illustration of a slit of the pad P1 is omitted.

The second configuration example illustrated in FIG. 32 is different from the first configuration example illustrated in FIG. 31 in that the second insulating layer 12 includes an end portion 12E on the side closer to the display area DA as compared to the pad P1. That is, the second insulating layer 12 is not provided between the pad P1 and the seal SE. Note that the first alignment film AL1 may be interposed between the pad P1 and the seal SE, and between the second insulating layer 12 and the seal SE.

Also in the second configuration example as described above, the same advantages as those of the first configuration example can be obtained.

Display Panel: Third Configuration Example

FIG. 33 is a cross-sectional view showing a third configuration example of the display panel PNL taken along line A-B including the contact hole V1 shown in FIG. 10.

The third configuration example shown in FIG. 33 is different from the first configuration example illustrated in FIG. 31 in that an upper pad MP corresponding to the third conductive layer is provided. The upper pad MP is located between the second insulating layer 12 and the seal SE. Such an upper pad MP is formed of the same material as that of the metal layer M shown in FIG. 12. Also, the upper pad MP may be formed in the same layer as the metal layer M. The upper pad MP is located above the pad P1. The second insulating layer 12 is located between the pad P1 and the upper pad MP. Further, the second insulating layer 12 includes a penetrated portion VP penetrated to the pad P1. The upper pad MP is electrically connected to the pad P1 via the penetrated portion VP. The upper pad MP includes a fourth hole VD connected to the third hole VC. In the example illustrated, the fourth hole VD is connected to the first portion VC1 and the second portion VC2 of the third hole VC. The connecting material C is in contact with not only the pad P1, but also the upper pad MP.

According to the third configuration example as described above, the same advantages as those of the first configuration example can be obtained. Further, as compared to the first configuration example, a contact area can be increased as a result of an increase in the contact area of the connecting material C with the upper pad MP.

As explained above, according to the present embodiment, a display device for which the frame can be narrowed and the cost can be reduced can be provided, and a method of manufacturing the same can also be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An example of the display device which can be obtained from the structure disclosed in the present specification is noted as follows:

(1) An electronic apparatus comprising:
a first substrate comprising a first basement and a first conductive layer;
a second substrate comprising:
a second basement, which is opposed to the first conductive layer and is separated from the first conductive layer,
a second conductive layer, and
a first hole penetrating the second basement; and
a connecting material which electrically connects the first conductive layer and the second conductive layer via the first hole.

(2) The electronic apparatus according to (1), in which the first conductive layer includes a second hole opposed to the first hole.

(3) The electronic apparatus according to (2), in which:
the first conductive layer includes a first upper surface, and a first inner surface facing the second hole; and
the connecting material is in contact with the first upper surface and the first inner surface.

(4) The electronic apparatus according to (2), in which the first basement includes a concavity opposed to the second hole.

(5) The electronic apparatus according to (4), in which the connecting material is in contact with the concavity.

(6) The electronic apparatus according to (1), in which the second conductive layer is located on the second basement on a side opposite to a side that is opposed to the first conductive layer.

(7) The electronic apparatus according to (2), further comprising an organic insulating layer located between the first conductive layer and the second basement, wherein the organic insulating layer includes a third hole connected to the first hole and the second hole.

(8) The electronic apparatus according to (7), in which:
the organic insulating layer comprises a first organic insulating layer provided in the first substrate, a seal which bonds the first substrate and the second substrate together, and a second organic insulating layer provided in the second substrate; and
the third hole includes a first portion penetrating the first organic insulating layer, a second portion penetrating the seal, and a third portion penetrating the second organic insulating layer.

(9) The electronic apparatus according to (1), in which:
the second conductive layer includes a second upper surface, and a second inner surface facing the first hole; and
the connecting material is in contact with the second upper surface and the second inner surface.

(10) The electronic apparatus according to (1), in which:
the second conductive layer includes,
a first layer,
a second layer overlapping the first layer and having a lower reflectance than the first layer, and
an aperture in which the second layer is removed and the first layer is exposed; and
the connecting material is in contact with the second layer, and also contacts the first layer in the aperture.

(11) The electronic apparatus according to (1), further comprising an organic insulating layer which is located between the first conductive layer and the second basement, and is in contact with the first upper surface, wherein:
the first conductive layer includes a first upper surface;
the organic insulating layer includes a third hole connected to the first hole; and
the connecting material is in contact with the first upper surface via the third hole.

(12) The electronic apparatus according to (11), in which:
the first conductive layer includes a second hole opposed to the first hole, and a first
inner surface facing the second hole; and
the connecting material is in contact with the first inner surface.

(13) The electronic apparatus according to (12), in which the third hole is greater than the second hole in planar view.

(14) The electronic apparatus according to (11), in which a portion of the first upper surface that is in contact with the connecting material is formed to be annular.

(15) The electronic apparatus according to (11), in which:
the organic insulating layer includes a first organic insulating layer which is provided in the first substrate and is in contact with the first upper surface, and a seal which bonds the first substrate and the second substrate together;
the third hole includes a first portion penetrating the first organic insulating layer, and a second portion penetrating the seal;
the first substrate comprises a third conductive layer which is located between the first organic insulating layer and the seal, and is electrically connected to the first conductive layer;
the third conductive layer includes an annular portion which is not covered with the first organic insulating layer and the seal; and the connecting material is in contact with the annular portion.

(16) The electronic apparatus according to (1), in which:
the second basement includes a first surface opposed to the first conductive layer, and a second surface on a side opposite to the first surface;
the first hole penetrates the first surface and the second surface; and
the first hole includes a first portion provided within the first surface, and a second portion provided within the second surface, the first portion being smaller than the second portion.

(17) The electronic apparatus according to (16), in which a width of the first hole is increased from the first surface toward the second surface in a cross-sectional view.

(18) The electronic apparatus according to (16), in which each of the first portion and the second portion is formed in a circular shape, and the first hole is formed in a shape of a truncated cone.

(19) The electronic apparatus according to (18), in which centers of the first portion and the second portion are located on a same straight line that is parallel to a normal of the second basement.

(20) The electronic apparatus according to (16), in which the first hole includes at least one of a straight line and a curved line in a cross-sectional view between the first portion and the second portion.

(21) The electronic apparatus according to (2), in which the first conductive layer includes a slit at a periphery of the second hole.

(22) The electronic apparatus according to (8), in which:
the organic insulating layer includes a first organic insulating layer provided in the first substrate, a second organic insulating layer provided in the second substrate, and a seal which bonds the first substrate and the second substrate together;
the first substrate comprises a third conductive layer which is located between the first organic insulating layer and the seal, and is electrically connected to the first conductive layer; and
the third conductive layer includes a fourth hole connected to the third hole.

(23) An electronic apparatus comprising:
a first substrate comprising a first basement and a first conductive layer;
a second substrate comprising:
a second basement, which is opposed to the first conductive layer and is separated from the first conductive layer,
a second conductive layer, and
a first hole penetrating the second basement; and
a connecting material which electrically connects the first conductive layer and the second conductive layer via the first hole,
the second conductive layer comprising:
a detector which detects touch or approach of an object in a first area; and
a terminal connected to the detector in a second area adjacent to the first area,
the first hole being formed in the terminal.

(24) The electronic apparatus according to (23), further comprising a detection circuit which is electrically connected to the first conductive layer, and reads a sensor signal output from the second conductive layer.

(25) The electronic apparatus according to (24) in which the first substrate comprises a sensor driving electrode which crosses the detector.

(26) A method of manufacturing an electronic apparatus, the method comprising:
preparing a first substrate comprising a first basement and a first conductive layer, and a second substrate comprising a second basement and a second conductive layer, the second basement being opposed to the first conductive layer and being separated from the first conductive layer;
irradiating a laser beam onto the second substrate and forming a first hole which penetrates the second basement; and
forming a connecting material which electrically connects the first conductive layer and the second conductive layer via the first hole.

(27) The method according to (26), further comprising forming a second hole, which penetrates the first conductive layer at a position opposed to the first hole, by irradiating the laser beam.

(28) The method according to (27), further comprising forming a concavity in the first basement at a position opposed to the second hole, by irradiating the laser beam.

(a1) An electronic apparatus comprising:
a first substrate comprising a first glass basement and a first conductive layer;
a second substrate comprising a second glass basement, which is opposed to the first conductive layer and is separated from the first conductive layer, and a second conductive layer, the second substrate including a first hole penetrating the second glass basement; and
a connecting material which electrically connects the first conductive layer and the second conductive layer via the first hole.

(a2) The electronic apparatus according to (a1), in which the first conductive layer includes a second hole opposed to the first hole.

(a3) The electronic apparatus according to (a2), in which the connecting material is in contact with an upper surface of the first conductive layer and an inner surface of the first conductive layer in the second hole.

(a4) The electronic apparatus according to (a2) or (a3), in which the first glass basement includes a concavity opposed to the second hole.

(a5) The electronic apparatus according to (a4), in which the connecting material is in contact with the concavity.

(a6) The electronic apparatus according to any one of (a1) to (a5), in which the second conductive layer is located on the second glass basement on a side opposite to a side that is opposed to the first conductive layer.

(a7) An electronic apparatus comprising:
a first substrate comprising a first glass basement and a first conductive layer;
a second substrate comprising:
a second glass basement, which is opposed to the first conductive layer and is separated from the first conductive layer, and
a second conductive layer,
a first hole penetrating the second glass basement; and
a connecting material which electrically connects the first conductive layer and the second conductive layer via the first hole,
the second conductive layer comprising:
a detector which detects touch or approach of an object in a first area; and
a terminal connected to the detector in a second area adjacent to the first area, the first hole being formed in the terminal.

(a8) The electronic apparatus according to (a7), further comprising a detection circuit which is electrically connected to the first conductive layer, and reads a sensor signal output from the second conductive layer.

(a9) The electronic apparatus according to (a7) or (a8), in which the first substrate comprises a sensor driving electrode which crosses the second conductive layer.

(a10) The electronic apparatus according to (a2), further comprising an organic insulating layer located between the first conductive layer and the second glass basement, in which the organic insulating layer includes a third hole connected to the first hole and the second hole.

(a11) The electronic apparatus according to (a10), in which:

the organic insulating layer comprises a first organic insulating layer provided in the first substrate, a seal which bonds the first substrate and the second substrate together, and a second organic insulating layer provided in the second substrate; and
the third hole includes a first hole penetrating the first organic insulating layer, a second hole penetrating the seal, and a third hole penetrating the second organic insulating layer.

(a12) The electronic apparatus according to any one of (a1) to (a11), in which the connecting material is in contact with an upper surface and an inner surface of the second conductive layer.

(a13) The electronic apparatus according to any one of (a1) to (a11), in which:
the second conductive layer includes a stacked layer body formed of a first layer and a second layer having a lower reflectance than the first layer;
an aperture in which the second layer is removed is formed in an area where the second conductive layer and connecting material contact each other; and
the connecting material is in contact with the first layer in the aperture.

(a14) A method of manufacturing an electronic apparatus, the method comprising:
preparing a first substrate comprising a first glass basement and a first conductive layer, and a second substrate comprising a second glass basement and a second conductive layer, the second glass basement being opposed to the first conductive layer and being separated from the first conductive layer;
irradiating a laser beam onto the second substrate and forming a first hole which penetrates the second glass basement; and
forming a connecting material which electrically connects the first conductive layer and the second conductive layer via the first hole.

(a15) The method according to (a14), further forming a second hole, which penetrates the first conductive layer at a position opposed to the first hole, by irradiating the laser beam.

(a16) The method according to (a15), further forming a concavity on the first glass basement at a position opposed to the second hole, by irradiating the laser beam.

(b1) An electronic apparatus comprising:
a first substrate including a first glass basement and a first conductive layer;
a second substrate including a second glass basement, which is opposed to the first glass basement and the first conductive layer, and a second conductive layer;
an organic insulating layer which is located between the first conductive layer and the second glass basement, and is in contact with an upper surface of the first conductive layer;
a contact hole including a first hole penetrating the second glass basement, a second hole penetrating the first conductive layer and being opposed to the first hole, and a third hole penetrating the organic insulating layer and being connected to the first hole and the second hole; and
a connecting material which electrically connects the first conductive layer and the second conductive layer via the contact hole, in which
the connecting material is in contact with the upper surface of the first conductive layer, and an inner surface of the first conductive layer in the second hole.

(b2) The electronic apparatus according to (b1), in which the third hole is greater than the second hole in size in planar view.

(b3) The electronic apparatus according to (b1), in which an area of the upper surface of the first conductive layer that is in contact with the connecting material is not covered with the organic insulating layer.

(b4) The electronic apparatus according to (b3), in which the area is formed to be annular.

(b5) The electronic apparatus according to (b1), in which the second conductive layer is located on the second glass basement on a side opposite to a side that is opposed to the first conductive layer.

(b6) The electronic apparatus according to (b1), in which:
the organic insulating layer includes a first organic insulating layer which is provided in the first substrate and is in contact with the upper surface of the first conductive layer, a second organic insulating layer provided in the second substrate, and a seal which bonds the first substrate and the second substrate together; and
the third hole includes a first portion penetrating the first organic insulating layer, a second portion penetrating the seal, and a third portion penetrating the second organic insulating layer.

(b7) The electronic apparatus according to (b1), in which:
the organic insulating layer includes a first organic insulating layer which is provided in the first substrate and is in contact with the upper surface of the first conductive layer, and a seal which bonds the first substrate and the second substrate together;
the third hole includes a first portion penetrating the first organic insulating layer, and a second portion penetrating the seal;
the first substrate includes a third conductive layer which is located between the first organic insulating layer and the seal, includes an annular portion which is not covered with the first organic insulating layer and the seal, and is electrically connected to the first conductive layer;
the contact hole includes a fourth hole which penetrates the third conductive layer and is connected to the first portion and the second portion; and
the connecting material is in contact with the annular portion.

(b8) An electronic apparatus comprising:
a first substrate including a first glass basement and a first conductive layer;
a second substrate including a second glass basement, which is opposed to the first glass basement and the first conductive layer, and a second conductive layer;
an organic insulating layer which is located between the first conductive layer and the second glass basement, and is in contact with an upper surface of the first conductive layer;
a contact hole including a first hole penetrating the second glass basement, a second hole penetrating the first conductive layer and being opposed to the first hole, and a third hole penetrating the organic insulating layer and being connected to the first hole and the second hole; and
a connecting material which electrically connects the first conductive layer and the second conductive layer via the contact hole, in which:
the connecting material is in contact with the upper surface of the first conductive layer, and an inner surface of the first conductive layer in the second hole;
the second conductive layer includes a detector located in a first area, and a terminal which is located in a second area adjacent to the first area and is connected to the detector;
the first hole is provided in the second area; and
the connecting material is electrically connected to the terminal in the second area.

(b9) The electronic apparatus according to (b8), further comprising a detection circuit which is electrically connected to the first conductive layer, and reads a sensor signal output from the second conductive layer.

(b10) The electronic apparatus according to (b8), in which the first substrate includes a sensor driving electrode which crosses the detector.

(c1) An electronic apparatus comprising:
a first substrate comprising a first glass basement and a first conductive layer;
a second substrate comprising a second glass basement including a first surface, which is opposed to the first conductive layer and is separated from the first conductive layer, and a second surface on a side opposite to the first surface, and a second conductive layer located on the second surface, the second substrate including a first hole penetrating the first surface and the second surface; and
a connecting material which electrically connects the first conductive layer and the second conductive layer via the first hole, in which
the first hole includes a first portion provided within the first surface, and a second portion provided within the second surface, the first portion being smaller than the second portion.

(c2) The electronic apparatus according to (c1), in which a width of the first hole is increased from the first surface toward the second surface in a cross-sectional view.

(c3) The electronic apparatus according to (c1) or (c2), in which each of the first portion and the second portion is formed in a circular shape, and the first hole is formed in a shape of a truncated cone.

(c4) The electronic apparatus according to (c3), in which centers of the first portion and the second portion are located on a same straight line that is parallel to a normal of the second glass basement.

(c5) The electronic apparatus according to (c1) or (c2), in which an inner surface of the first hole includes at least one of a straight line and a curved line in a cross-sectional view.

(c6) The electronic apparatus according to any one of (c1) to (c5), in which the connecting material is in contact with an upper surface of the second conductive layer, and an inner surface of the second conductive layer in the first hole.

(c7) The electronic apparatus according to any one of (c1) to (c6), in which the first conductive layer includes a second hole opposed to the first hole.

(c8) The electronic apparatus according to (c7), in which the connecting material is in contact with an upper surface of the first conductive layer and an inner surface of the first conductive layer in the second hole.

(c9) The electronic apparatus according to (c7) or (c8), in which:
the first glass basement includes a concavity opposed to the second hole; and
the connecting material is in contact with the concavity.

(c10) The electronic apparatus according to any one of (c7) to (c9), in which the first conductive layer includes a slit at a periphery of the second hole.

(c11) An electronic apparatus comprising:
a first substrate comprising a first glass basement and a first conductive layer;
a second substrate comprising a second glass basement including a first surface, which is opposed to the first conductive layer and is separated from the first conductive layer, and a second surface on a side opposite to the first surface, and a second conductive layer located on the second surface, the second substrate including a first hole penetrating the first surface and the second surface; and a connecting material which electrically connects the first conductive layer and the second conductive layer via the first hole, in which:

the first hole includes a first portion provided within the first surface, and a second portion provided within the second surface, the first portion being smaller than the second portion;

the second conductive layer comprises a detector which detects touch or approach of an object in a first area, and a terminal connected to the detector in a second area adjacent to the first area; and the first hole is formed in the terminal.

(c12) The electronic apparatus according to (c11), further comprising a detection circuit which is electrically connected to the first conductive layer, and reads a sensor signal output from the second conductive layer.

(c13) The electronic apparatus according to (c11) or (c12), in which the first substrate comprises a sensor driving electrode which crosses the second conductive layer.

(c14) The electronic apparatus according to any one of (c11) to (c13), in which the first area is a display area including a plurality of pixels, and the second area is a non-display area surrounding the display area.

(c15) An electronic apparatus comprising:
a first substrate comprising a first glass basement and a first conductive layer;
a second substrate comprising a second glass basement including a first surface, which is opposed to the first conductive layer and is separated from the first conductive layer, and a second surface on a side opposite to the first surface, and a second conductive layer located on the second surface, the second substrate including a first hole penetrating the first surface and the second surface;
an organic insulating layer which is located between the first conductive layer and the second glass basement, and includes a third hole connected to the first hole; and
a connecting material which electrically connects the first conductive layer and the second conductive layer via the first hole and the third hole, in which:

the first hole includes a first portion provided within the first surface, and a second portion provided within the second surface, the first portion being smaller than the second portion.

(c16) The electronic apparatus according to (c15), in which:

the organic insulating layer comprises a first organic insulating layer provided in the first substrate, a seal which bonds the first substrate and the second substrate together, and a second organic insulating layer provided in the second substrate; and the third hole includes a first hole penetrating the first organic insulating layer, a second hole penetrating the seal, and a third hole penetrating the second organic insulating layer.

(c17) The electronic apparatus according to (c16), in which:

the organic insulating layer comprises a first organic insulating layer provided in the first substrate, a second organic insulating layer provided in the second substrate, and a seal which bonds the first substrate and the second substrate together;

the electronic apparatus comprises a third conductive layer which is located between the first organic insulating layer and the seal, and is electrically connected to the first conductive layer; and the third conductive layer includes a fourth hole connected to the third hole.

What is claimed is:

1. An electronic apparatus comprising:
   a first substrate comprising a first basement and a first conductive layer;
   a second substrate comprising:
      a second basement, which is opposed to the first conductive layer and is separated from the first conductive layer,
      a second conductive layer, and
      a first hole penetrating the second basement; and
   a connecting material which electrically connects the first conductive layer and the second conductive layer via the first hole; and
   an organic insulating layer located between the first conductive layer and the second basement,
   wherein the first conductive layer includes a second hole opposed to the first hole, and
   the organic insulating layer includes a third hole connected to the first hole and the second hole.

2. The electronic apparatus according to claim 1, wherein:
   the first conductive layer includes a first upper surface, and a first inner surface facing the second hole; and
   the connecting material is in contact with the first upper surface and the first inner surface.

3. The electronic apparatus according to claim 1, wherein the first basement includes a concavity opposed to the second hole.

4. The electronic apparatus according to claim 3, wherein the connecting material is in contact with the concavity.

5. The electronic apparatus according to claim 1, wherein:
   the organic insulating layer comprises a first organic insulating layer provided in the first substrate, a seal which bonds the first substrate and the second substrate together, and a second organic insulating layer provided in the second substrate; and
   the third hole includes a first portion penetrating the first organic insulating layer, a second portion penetrating the seal, and a third portion penetrating the second organic insulating layer.

6. The electronic apparatus according to claim 1, wherein the first conductive layer includes a slit at a periphery of the second hole.

7. The electronic apparatus according to claim 5, wherein:
   the organic insulating layer includes a first organic insulating layer provided in the first substrate, a second organic insulating layer provided in the second substrate, and a seal which bonds the first substrate and the second substrate together;
   the first substrate comprises a third conductive layer which is located between the first organic insulating layer and the seal, and is electrically connected to the first conductive layer; and
   the third conductive layer includes a fourth hole connected to the third hole.

* * * * *